(12) United States Patent
Shen et al.

(10) Patent No.: US 11,205,600 B2
(45) Date of Patent: Dec. 21, 2021

(54) INTEGRATED CIRCUITS PROTECTED BY SUBSTRATES WITH CAVITIES, AND METHODS OF MANUFACTURE

(71) Applicant: INVENSAS CORPORATION, San Jose, CA (US)

(72) Inventors: Hong Shen, Oak Park, CA (US); Charles G. Woychik, Niskayuna, NY (US); Sitaram R. Arkalgud, Cupertino, CA (US)

(73) Assignee: Invensas Corporation, San Jose, CA (US)

(*) Notice: Subject to any disclaimer, the term of this patent is extended or adjusted under 35 U.S.C. 154(b) by 0 days.

(21) Appl. No.: 16/599,683

(22) Filed: Oct. 11, 2019

(65) Prior Publication Data

US 2020/0043817 A1    Feb. 6, 2020

Related U.S. Application Data

(60) Continuation of application No. 15/865,842, filed on Jan. 9, 2018, now Pat. No. 10,446,456, which is a
(Continued)

(51) Int. Cl.
*H01L 23/055* (2006.01)
*H01L 25/065* (2006.01)
(Continued)

(52) U.S. Cl.
CPC ........ *H01L 23/055* (2013.01); *H01L 21/2885* (2013.01); *H01L 21/4803* (2013.01);
(Continued)

(58) Field of Classification Search
CPC . H01L 23/315; H01L 21/56; H01L 21/76879; H01L 21/76897; H01L 23/04;
(Continued)

(56) References Cited

U.S. PATENT DOCUMENTS

| 4,998,665 A | 3/1991 | Hayashi |
| 5,087,585 A | 2/1992 | Hayashi |

(Continued)

FOREIGN PATENT DOCUMENTS

| EP | 1418617 A2 | 5/2004 |
| EP | 1884994 A2 | 6/2008 |

(Continued)

OTHER PUBLICATIONS

Amirfeiz et al., "Formation of silicon structures by plasma-activated wafer bonding," Journal of The Electrochemical Society, 2000, vol. 147, No. 7, pp. 2693-2698.

(Continued)

*Primary Examiner* — Cuong B Nguyen
(74) *Attorney, Agent, or Firm* — Knobbe, Martens, Olson & Bear LLP

(57) ABSTRACT

Dies (110) with integrated circuits are attached to a wiring substrate (120), possibly an interposer, and are protected by a protective substrate (410) attached to a wiring substrate. The dies are located in cavities in the protective substrate (the dies may protrude out of the cavities). In some embodiments, each cavity surface puts pressure on the die to strengthen the mechanical attachment of the die the wiring substrate, to provide good thermal conductivity between the dies and the ambient (or a heat sink), to counteract the die warpage, and possibly reduce the vertical size. The protective substrate may or may not have its own circuitry connected to the dies or to the wiring substrate. Other features are also provided.

22 Claims, 19 Drawing Sheets

Related U.S. Application Data division of application No. 15/265,148, filed on Sep. 14, 2016, now Pat. No. 9,899,281, which is a continuation of application No. 14/214,365, filed on Mar. 14, 2014, now abandoned.

(60) Provisional application No. 61/952,066, filed on Mar. 12, 2014.

(51) Int. Cl.

| | | |
|---|---|---|
| *H01L 23/31* | (2006.01) | |
| *H01L 21/56* | (2006.01) | |
| *H01L 23/04* | (2006.01) | |
| *H01L 23/14* | (2006.01) | |
| *H01L 23/367* | (2006.01) | |
| *H01L 23/00* | (2006.01) | |
| *H01L 21/288* | (2006.01) | |
| *H01L 21/768* | (2006.01) | |
| *H01L 23/498* | (2006.01) | |
| *H01L 25/00* | (2006.01) | |
| *H01L 23/48* | (2006.01) | |
| *H01L 23/538* | (2006.01) | |
| *H01L 21/48* | (2006.01) | |
| *H01L 23/10* | (2006.01) | |

(52) U.S. Cl.
CPC ............ *H01L 21/486* (2013.01); *H01L 21/56* (2013.01); *H01L 21/76879* (2013.01); *H01L 21/76897* (2013.01); *H01L 23/04* (2013.01); *H01L 23/147* (2013.01); *H01L 23/315* (2013.01); *H01L 23/3107* (2013.01); *H01L 23/3675* (2013.01); *H01L 23/481* (2013.01); *H01L 23/49827* (2013.01); *H01L 23/49838* (2013.01); *H01L 23/5389* (2013.01); *H01L 24/97* (2013.01); *H01L 25/0652* (2013.01); *H01L 25/0655* (2013.01); *H01L 25/50* (2013.01); *H01L 21/561* (2013.01); *H01L 23/10* (2013.01); *H01L 23/49816* (2013.01); *H01L 2224/16145* (2013.01); *H01L 2224/16225* (2013.01); *H01L 2224/32225* (2013.01); *H01L 2224/73204* (2013.01); *H01L 2225/06548* (2013.01); *H01L 2225/06555* (2013.01); *H01L 2924/12042* (2013.01); *H01L 2924/15311* (2013.01); *H01L 2924/181* (2013.01)

(58) Field of Classification Search
CPC .............. H01L 23/147; H01L 23/3107; H01L 23/3675; H01L 23/49827; H01L 24/97; H01L 25/0652; H01L 25/50; H01L 23/49838; H01L 2224/16145; H01L 2224/16225; H01L 2224/32225; H01L 2224/73204; H01L 2924/12042; H01L 2924/15311; H01L 2924/181; H01L 23/055; H01L 21/4803; H01L 21/486; H01L 25/0655; H01L 23/481; H01L 23/5389; H01L 21/2885; H01L 21/561; H01L 23/49816; H01L 2225/06548; H01L 225/06555; H01L 2224/3225; H01L 23/10; H01L 2224/16235; H01L 2224/17181

See application file for complete search history.

(56) References Cited

U.S. PATENT DOCUMENTS

| | | |
|---|---|---|
| 5,322,593 A | 6/1994 | Hasegawa et al. |
| 5,532,519 A | 7/1996 | Bertin et al. |
| 5,701,233 A | 12/1997 | Carson et al. |
| 5,753,536 A | 5/1998 | Sugiyama et al. |
| 5,771,555 A | 6/1998 | Eda et al. |
| 5,985,739 A | 11/1999 | Plettner et al. |
| 5,998,808 A | 12/1999 | Matsushita |
| 6,008,126 A | 12/1999 | Leedy |
| 6,008,536 A | 12/1999 | Mertol |
| 6,080,640 A | 6/2000 | Gardner et al. |
| 6,157,076 A | 12/2000 | Azotea et al. |
| 6,222,722 B1 | 4/2001 | Fukuzumi et al. |
| 6,251,796 B1 | 6/2001 | Abdul-Ridha et al. |
| 6,265,775 B1 | 7/2001 | Seyyedy |
| 6,322,903 B1 | 11/2001 | Siniaguine et al. |
| 6,374,770 B1 | 4/2002 | Lee |
| 6,384,473 B1 | 5/2002 | Peterson et al. |
| 6,403,444 B2 | 6/2002 | Fukuzumi et al. |
| 6,423,640 B1 | 7/2002 | Lee et al. |
| 6,451,650 B1 | 9/2002 | Lou |
| 6,465,892 B1 | 10/2002 | Suga |
| 6,492,726 B1 | 12/2002 | Quek et al. |
| 6,613,672 B1 | 9/2003 | Wang et al. |
| 6,620,701 B2 | 9/2003 | Ninq |
| 6,624,505 B2 | 9/2003 | Badehl |
| 6,717,256 B1 | 4/2004 | Siniaguine |
| 6,746,876 B2 | 6/2004 | Itoh et al. |
| 6,787,916 B2 | 9/2004 | Halahan |
| 6,876,062 B2 | 4/2005 | Lee et al. |
| 6,887,769 B2 | 5/2005 | Kellar et al. |
| 6,908,027 B2 | 6/2005 | Tolchinsky et al. |
| 6,947,275 B1 | 9/2005 | Anderson et al. |
| 6,958,285 B2 | 10/2005 | Siniaguine |
| 6,998,712 B2 | 2/2006 | Okada et al. |
| 7,011,988 B2 | 3/2006 | Forcier |
| 7,045,453 B2 | 5/2006 | Canaperi et al. |
| 7,049,170 B2 | 5/2006 | Savastiouk et al. |
| 7,057,274 B2 | 6/2006 | Heschel |
| 7,061,102 B2 | 6/2006 | Eghan et al. |
| 7,078,811 B2 | 7/2006 | Suga |
| 7,105,980 B2 | 9/2006 | Abbott et al. |
| 7,115,988 B1 | 10/2006 | Hool |
| 7,144,745 B2 | 12/2006 | Badehl |
| 7,183,643 B2 | 2/2007 | Gibson et al. |
| 7,186,586 B2 | 3/2007 | Savastiouk et al. |
| 7,193,423 B1 | 3/2007 | Dalton et al. |
| 7,354,798 B2 | 4/2008 | Pogge et al. |
| 7,359,591 B2 | 4/2008 | Vandentop et al. |
| 7,400,036 B2 | 7/2008 | Tan |
| 7,467,897 B2 | 12/2008 | Hauffe et al. |
| 7,622,324 B2 | 11/2009 | Enquist et al. |
| 7,670,921 B2 | 3/2010 | Chinthakindi et al. |
| 7,750,488 B2 | 7/2010 | Patti et al. |
| 7,786,591 B2 | 8/2010 | Khan et al. |
| 7,803,693 B2 | 9/2010 | Trezza |
| 7,863,096 B2 | 1/2011 | England |
| 7,906,803 B2 | 3/2011 | Shiova et al. |
| 7,928,548 B2 | 4/2011 | Bernstein et al. |
| 7,964,508 B2 | 6/2011 | Savastiouk et al. |
| 7,972,683 B2 | 7/2011 | Gudeman et al. |
| 7,977,579 B2 | 7/2011 | Bathan et al. |
| 7,989,270 B2 | 8/2011 | Huang et al. |
| 8,018,068 B1 | 9/2011 | Scanlan et al. |
| 8,071,470 B2 | 12/2011 | Khor et al. |
| 8,072,082 B2 | 12/2011 | Yean et al. |
| 8,076,788 B2 | 12/2011 | Haba et al. |
| 8,102,039 B2 | 1/2012 | Noma et al. |
| 8,110,862 B2 | 2/2012 | Cheng et al. |
| 8,183,127 B2 | 5/2012 | Patti et al. |
| 8,183,696 B2 | 5/2012 | Meyer et al. |
| 8,191,756 B2 | 6/2012 | Coppeta et al. |
| 8,241,961 B2 | 8/2012 | Kim et al. |
| 8,257,985 B2 | 9/2012 | Stevenson et al. |
| 8,269,671 B2 | 9/2012 | Chen et al. |
| 8,314,007 B2 | 11/2012 | Vaufredaz |
| 8,349,635 B1 | 1/2013 | Gan et al. |
| 8,357,931 B2 | 1/2013 | Schieck et al. |
| 8,377,798 B2 | 2/2013 | Peng et al. |
| 8,377,829 B2 | 2/2013 | Yeh et al. |
| 8,378,480 B2 | 2/2013 | Cheng et al. |
| 8,395,229 B2 | 3/2013 | Garcia-Blanco et al. |

(56) References Cited

U.S. PATENT DOCUMENTS

| | | |
|---|---|---|
| 8,397,013 B1 | 3/2013 | Rosenband et al. |
| 8,411,444 B2 | 4/2013 | Gaynes et al. |
| 8,426,961 B2 | 4/2013 | Shih et al. |
| 8,441,131 B2 | 5/2013 | Ryan |
| 8,470,668 B2 | 6/2013 | Cho et al. |
| 8,476,146 B2 | 7/2013 | Chen et al. |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,518,753 B2 | 8/2013 | Wu et al. |
| 8,519,537 B2 | 8/2013 | Jenq et al. |
| 8,524,533 B2 | 9/2013 | Tong et al. |
| 8,525,318 B1 | 9/2013 | Kim et al. |
| 8,530,997 B1 | 9/2013 | Yang et al. |
| 8,546,928 B2 | 10/2013 | Merz et al. |
| 8,575,493 B1 | 11/2013 | Xu et al. |
| 8,598,695 B2 | 12/2013 | Oganesian et al. |
| 8,620,164 B2 | 12/2013 | Heck et al. |
| 8,629,546 B1 | 1/2014 | Scanlan et al. |
| 8,647,987 B2 | 2/2014 | Yang et al. |
| 8,674,423 B2 | 3/2014 | Collins et al. |
| 8,697,493 B2 | 4/2014 | Sadaka |
| 8,716,105 B2 | 5/2014 | Sadaka et al. |
| 8,802,538 B1 | 8/2014 | Liu |
| 8,809,123 B2 | 8/2014 | Liu et al. |
| 8,830,689 B2 | 9/2014 | Kim et al. |
| 8,841,002 B2 | 9/2014 | Tong |
| 8,916,448 B2 | 12/2014 | Cheng et al. |
| 8,988,299 B2 | 3/2015 | Kam et al. |
| 9,093,350 B2 | 7/2015 | Endo et al. |
| 9,142,517 B2 | 9/2015 | Liu |
| 9,165,793 B1 | 10/2015 | Wang et al. |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,252,127 B1 | 2/2016 | Shen et al. |
| 9,257,399 B2 | 2/2016 | Kuang et al. |
| 9,299,736 B2 | 3/2016 | Chen et al. |
| 9,312,229 B2 | 4/2016 | Chen et al. |
| 9,324,626 B2 | 4/2016 | Shen et al. |
| 9,337,235 B2 | 5/2016 | Chen et al. |
| 9,355,997 B2 | 5/2016 | Katkar et al. |
| 9,368,479 B2 | 6/2016 | Katkar et al. |
| 9,368,866 B2 | 6/2016 | Yu |
| 9,379,074 B2 | 6/2016 | Uzoh et al. |
| 9,385,024 B2 | 7/2016 | Tong et al. |
| 9,386,688 B2 | 7/2016 | MacDonald et al. |
| 9,391,143 B2 | 7/2016 | Tong et al. |
| 9,394,161 B2 | 7/2016 | Cheng et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,478,504 B1 | 10/2016 | Shen et al. |
| 9,496,239 B1 | 11/2016 | Edelstein et al. |
| 9,536,848 B2 | 1/2017 | England et al. |
| 9,559,081 B1 | 1/2017 | Lai et al. |
| 9,620,464 B2 | 4/2017 | Baks et al. |
| 9,620,481 B2 | 4/2017 | Edelstein et al. |
| 9,656,852 B2 | 5/2017 | Cheng et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,799,587 B2 | 10/2017 | Fujii et al. |
| 9,834,435 B1 | 12/2017 | Liu et al. |
| 9,852,988 B2 | 12/2017 | Enquist et al. |
| 9,881,882 B2 | 1/2018 | Hsu et al. |
| 9,893,004 B2 | 2/2018 | Yazdani |
| 9,899,442 B2 | 2/2018 | Katka |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 10,002,844 B1 | 6/2018 | Wang et al. |
| 10,026,605 B2 | 7/2018 | Doub et al. |
| 10,075,657 B2 | 9/2018 | Fahim et al. |
| 10,204,893 B2 | 2/2019 | Uzoh et al. |
| 10,269,756 B2 | 4/2019 | Uzoh |
| 10,276,619 B2 | 4/2019 | Kao et al. |
| 10,276,909 B2 | 4/2019 | Huang et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,508,030 B2 | 12/2019 | Katkar et al. |
| 10,727,219 B2 | 7/2020 | Uzoh et al. |
| 10,784,191 B2 | 9/2020 | Huang et al. |
| 10,923,408 B2 | 2/2021 | Huang et al. |
| 11,004,757 B2 | 5/2021 | Katkar et al. |
| 2002/0000328 A1 | 1/2002 | Motomura et al. |
| 2002/0003307 A1 | 1/2002 | Suga |
| 2002/0094608 A1 | 7/2002 | Brooks |
| 2002/0179921 A1 | 12/2002 | Cohn |
| 2003/0098060 A1 | 5/2003 | Yoshimi |
| 2004/0084414 A1 | 5/2004 | Sakai et al. |
| 2004/0134796 A1 | 7/2004 | Shelp et al. |
| 2004/0174682 A1 | 9/2004 | Lin et al. |
| 2004/0183187 A1 | 9/2004 | Yamasaki et al. |
| 2004/0201111 A1 | 10/2004 | Thurgood |
| 2004/0238934 A1 | 12/2004 | Warner et al. |
| 2004/0259325 A1 | 12/2004 | Gan |
| 2005/0009246 A1 | 1/2005 | Enquist et al. |
| 2005/0046002 A1 | 3/2005 | Lee et al. |
| 2005/0047094 A1 | 3/2005 | Hsu |
| 2005/0068739 A1 | 3/2005 | Arvelo et al. |
| 2005/0146021 A1 | 7/2005 | Edwards |
| 2005/0196095 A1 | 9/2005 | Karashima et al. |
| 2005/0263869 A1 | 12/2005 | Tanaka et al. |
| 2005/0266701 A1 | 12/2005 | Aoyagi |
| 2006/0001123 A1 | 1/2006 | Heck et al. |
| 2006/0057945 A1 | 3/2006 | Hsu et al. |
| 2006/0097335 A1 | 5/2006 | Kim et al. |
| 2006/0115323 A1 | 6/2006 | Coppeta et al. |
| 2006/0197215 A1 | 9/2006 | Potter |
| 2006/0208326 A1 | 9/2006 | Nasiri et al. |
| 2006/0231937 A1 | 10/2006 | Juskey et al. |
| 2007/0029562 A1 | 2/2007 | Koizumi |
| 2007/0029654 A1 | 2/2007 | Sunohara et al. |
| 2007/0045781 A1 | 3/2007 | Carlson et al. |
| 2007/0045795 A1 | 3/2007 | McBean |
| 2007/0045798 A1 | 3/2007 | Horie |
| 2007/0096294 A1 | 5/2007 | Ikeda et al. |
| 2007/0111386 A1 | 5/2007 | Kim et al. |
| 2007/0188054 A1 | 8/2007 | Hasken et al. |
| 2007/0197013 A1 | 8/2007 | Trezza |
| 2007/0221399 A1 | 9/2007 | Nishizawa et al. |
| 2007/0222048 A1 | 9/2007 | Huang |
| 2007/0235850 A1 | 10/2007 | Gerber et al. |
| 2007/0295456 A1 | 12/2007 | Gudeman et al. |
| 2008/0080832 A1 | 4/2008 | Chen et al. |
| 2008/0124835 A1 | 5/2008 | Chen et al. |
| 2008/0128897 A1 | 6/2008 | Chao |
| 2008/0211089 A1 | 9/2008 | Khan et al. |
| 2008/0244902 A1 | 10/2008 | Blackwell |
| 2008/0272477 A1 | 11/2008 | Do et al. |
| 2008/0280394 A1 | 11/2008 | Murtuza et al. |
| 2008/0290490 A1 | 11/2008 | Fujii et al. |
| 2008/0296709 A1 | 12/2008 | Haba et al. |
| 2009/0008762 A1 | 1/2009 | Jung et al. |
| 2009/0053855 A1 | 2/2009 | Summers |
| 2009/0057884 A1 | 3/2009 | Too et al. |
| 2009/0115047 A1 | 5/2009 | Haba et al. |
| 2009/0186446 A1* | 7/2009 | Kwon .................. H01L 23/055 438/107 |
| 2009/0212407 A1 | 8/2009 | Foster et al. |
| 2009/0236718 A1 | 9/2009 | Yang et al. |
| 2009/0267238 A1 | 10/2009 | Joseph et al. |
| 2010/0025081 A1 | 2/2010 | Arai et al. |
| 2010/0078786 A1 | 4/2010 | Maeda |
| 2010/0081236 A1 | 4/2010 | Yang et al. |
| 2010/0084761 A1 | 4/2010 | Shinagawa |
| 2010/0096713 A1 | 4/2010 | Jung |
| 2010/0102428 A1 | 4/2010 | Lee et al. |

(56) References Cited

U.S. PATENT DOCUMENTS

| | | |
|---|---|---|
| 2010/0134991 A1 | 6/2010 | Kim et al. |
| 2010/0144101 A1 | 6/2010 | Chow et al. |
| 2010/0148341 A1 | 6/2010 | Fuji et al. |
| 2010/0224980 A1 | 9/2010 | Chahal |
| 2010/0230797 A1 | 9/2010 | Honda |
| 2010/0230806 A1 | 9/2010 | Huang et al. |
| 2010/0140769 A1 | 10/2010 | Kim et al. |
| 2010/0276799 A1 | 11/2010 | Heng et al. |
| 2010/0288525 A1 | 11/2010 | Basavanhally et al. |
| 2010/0301432 A1 | 12/2010 | Kittilsland et al. |
| 2011/0027967 A1 | 2/2011 | Beyne et al. |
| 2011/0068444 A1 | 3/2011 | Chi et al. |
| 2011/0068468 A1 | 3/2011 | Lin et al. |
| 2011/0080713 A1 | 4/2011 | Sunohara |
| 2011/0095403 A1 | 4/2011 | Lee |
| 2011/0101349 A1 | 5/2011 | Oda |
| 2011/0115092 A1 | 5/2011 | Tago |
| 2011/0140283 A1 | 6/2011 | Chandra et al. |
| 2011/0147859 A1 | 6/2011 | Tanaka et al. |
| 2011/0156242 A1 | 6/2011 | Sakaguchi et al. |
| 2011/0215470 A1* | 9/2011 | Chen .................. H01L 24/97 257/738 |
| 2011/0221072 A1 | 9/2011 | Chin |
| 2011/0287606 A1 | 11/2011 | Brun et al. |
| 2011/0290552 A1 | 12/2011 | Palmateer et al. |
| 2011/0300668 A1 | 12/2011 | Parvarandeh |
| 2011/0304036 A1 | 12/2011 | Son |
| 2011/0309523 A1 | 12/2011 | Takahashi |
| 2012/0001339 A1 | 1/2012 | Malatkar |
| 2012/0020026 A1* | 1/2012 | Oganesian ........ H01L 21/76877 361/707 |
| 2012/0049332 A1 | 3/2012 | Chen et al. |
| 2012/0061776 A1 | 3/2012 | Cheng et al. |
| 2012/0061852 A1 | 3/2012 | Su et al. |
| 2012/0086135 A1 | 4/2012 | Thompson et al. |
| 2012/0091583 A1 | 4/2012 | Kawashita et al. |
| 2012/0097733 A1 | 4/2012 | Ebefors et al. |
| 2012/0100657 A1 | 4/2012 | Di Cioccio et al. |
| 2012/0101540 A1 | 4/2012 | O'Brien et al. |
| 2012/0104623 A1 | 5/2012 | Pagaila et al. |
| 2012/0106228 A1 | 5/2012 | Lee |
| 2012/0112335 A1 | 5/2012 | Ebefors et al. |
| 2012/0142144 A1* | 6/2012 | Taheri .................. B81B 7/007 438/107 |
| 2012/0212384 A1 | 8/2012 | Kam et al. |
| 2012/0228778 A1 | 9/2012 | Kosenko et al. |
| 2012/0267730 A1 | 10/2012 | Renard et al. |
| 2012/0276733 A1 | 11/2012 | Saeki et al. |
| 2012/0286380 A1 | 11/2012 | Yazdi et al. |
| 2012/0295415 A1 | 11/2012 | Ono |
| 2012/0319267 A1 | 12/2012 | Moon et al. |
| 2012/0319300 A1 | 12/2012 | Kim |
| 2012/0326248 A1 | 12/2012 | Daneman et al. |
| 2013/0010441 A1 | 1/2013 | Oganesian et al. |
| 2013/0014978 A1 | 1/2013 | Uzoh et al. |
| 2013/0032390 A1 | 2/2013 | Hu et al. |
| 2013/0069239 A1 | 3/2013 | Kim et al. |
| 2013/0082383 A1 | 4/2013 | Aoya |
| 2013/0082399 A1 | 4/2013 | Kim et al. |
| 2013/0087917 A1 | 4/2013 | Jee et al. |
| 2013/0093075 A1 | 4/2013 | Liu et al. |
| 2013/0099331 A1 | 4/2013 | Chen et al. |
| 2013/0099368 A1 | 4/2013 | Han |
| 2013/0105989 A1 | 5/2013 | Pagaila et al. |
| 2013/0119527 A1 | 5/2013 | Luo et al. |
| 2013/0119528 A1 | 5/2013 | Groothuis et al. |
| 2013/0146991 A1 | 6/2013 | Otremba et al. |
| 2013/0181354 A1 | 7/2013 | Khan et al. |
| 2013/0187245 A1 | 7/2013 | Chien et al. |
| 2013/0187292 A1 | 7/2013 | Semmelmeyer et al. |
| 2013/0228898 A1 | 9/2013 | Ide |
| 2013/0241026 A1 | 9/2013 | Or-Bach et al. |
| 2013/0267046 A1 | 10/2013 | Or-Bach et al. |
| 2013/0270660 A1 | 10/2013 | Bryzek et al. |
| 2013/0277774 A1 | 10/2013 | Frey et al. |
| 2013/0277777 A1 | 10/2013 | Chang et al. |
| 2013/0292840 A1 | 11/2013 | Shoemaker et al. |
| 2013/0293428 A1* | 11/2013 | Souriau .................. H01Q 19/10 343/702 |
| 2013/0313680 A1 | 11/2013 | Oqanesian et al. |
| 2014/0036454 A1 | 2/2014 | Caskey et al. |
| 2014/0070380 A1 | 3/2014 | Chiu et al. |
| 2014/0091461 A1 | 4/2014 | Shen |
| 2014/0134796 A1 | 5/2014 | Kelly et al. |
| 2014/0134803 A1 | 5/2014 | Kelly et al. |
| 2014/0134804 A1 | 5/2014 | Kelly |
| 2014/0175655 A1 | 6/2014 | Chen et al. |
| 2014/0178495 A1 | 6/2014 | Huang et al. |
| 2014/0217557 A1 | 8/2014 | Chen et al. |
| 2014/0225206 A1 | 8/2014 | Lin et al. |
| 2014/0225244 A1 | 8/2014 | Smith et al. |
| 2014/0225795 A1 | 8/2014 | Yu |
| 2014/0246227 A1 | 9/2014 | Lin et al. |
| 2014/0252655 A1 | 9/2014 | Tran et al. |
| 2014/0264653 A1 | 9/2014 | Cheng et al. |
| 2014/0264811 A1 | 9/2014 | Wu |
| 2014/0319683 A1 | 10/2014 | Lin et al. |
| 2014/0328023 A1 | 11/2014 | Choi et al. |
| 2014/0036141 A1 | 12/2014 | Yamamichi et al. |
| 2014/0361413 A1* | 12/2014 | Chapelon ........... H01L 25/0657 257/622 |
| 2015/0001632 A1 | 1/2015 | Liu et al. |
| 2015/0001731 A1 | 1/2015 | Shuto |
| 2015/0021755 A1 | 1/2015 | Hsiao et al. |
| 2015/0064498 A1 | 3/2015 | Tong |
| 2015/0068666 A1 | 3/2015 | Abe et al. |
| 2015/0091153 A1 | 4/2015 | Liu et al. |
| 2015/0097215 A1 | 4/2015 | Chu et al. |
| 2015/0137345 A1* | 5/2015 | Choi .................. H01L 23/04 257/713 |
| 2015/0262902 A1 | 9/2015 | Shen et al. |
| 2015/0262928 A1 | 9/2015 | Shen et al. |
| 2015/0262972 A1 | 9/2015 | Katka |
| 2015/0298965 A1 | 10/2015 | Tsai et al. |
| 2015/0333049 A1 | 11/2015 | Woychik |
| 2015/0336790 A1 | 11/2015 | Geen et al. |
| 2015/0336792 A1 | 11/2015 | Huang et al. |
| 2016/0002029 A1 | 1/2016 | Nasiri et al. |
| 2016/0079214 A1 | 3/2016 | Caskey |
| 2016/0107881 A1 | 4/2016 | Thompson et al. |
| 2016/0137492 A1 | 5/2016 | Cheng et al. |
| 2016/0229685 A1 | 8/2016 | Boysel |
| 2016/0240495 A1 | 8/2016 | Lachner et al. |
| 2016/0318757 A1 | 11/2016 | Chou et al. |
| 2016/0343682 A1 | 11/2016 | Kawasaki |
| 2017/0008757 A1 | 1/2017 | Cheng et al. |
| 2017/0062366 A1 | 3/2017 | Enquist |
| 2017/0081181 A1 | 3/2017 | Zhang et al. |
| 2017/0137281 A1 | 5/2017 | Favier et al. |
| 2017/0179029 A1 | 6/2017 | Enquist et al. |
| 2017/0194271 A1 | 7/2017 | Hsu et al. |
| 2017/0200711 A1 | 7/2017 | Uzoh et al. |
| 2017/0305738 A1 | 10/2017 | Chang et al. |
| 2017/0338214 A1 | 11/2017 | Uzoh et al. |
| 2018/0047682 A1 | 2/2018 | Chang et al. |
| 2018/0096931 A1 | 4/2018 | Huang et al. |
| 2018/0174995 A1 | 6/2018 | Wang et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0191047 A1 | 7/2018 | Huang et al. |
| 2018/0219038 A1 | 8/2018 | Gambino et al. |
| 2018/0226375 A1 | 8/2018 | Enquist et al. |
| 2018/0269161 A1 | 9/2018 | Wu et al. |
| 2018/0273377 A1 | 9/2018 | Katkar et al. |
| 2018/0286805 A1 | 10/2018 | Huang et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2018/0337157 A1 | 11/2018 | Wang et al. |
| 2019/0051628 A1 | 2/2019 | Liu et al. |
| 2019/0096741 A1 | 3/2019 | Uzoh et al. |

(56) References Cited

U.S. PATENT DOCUMENTS

| | | |
|---|---|---|
| 2019/0096842 A1 | 3/2019 | Fountain, Jr. et al. |
| 2019/0115277 A1 | 4/2019 | Yu et al. |
| 2019/0131277 A1 | 5/2019 | Yang et al. |
| 2019/0164914 A1 | 5/2019 | Hu et al. |
| 2019/0198407 A1 | 6/2019 | Huang et al. |
| 2019/0198409 A1 | 6/2019 | Katkar et al. |
| 2019/0265411 A1 | 8/2019 | Huang et al. |
| 2019/0333550 A1 | 10/2019 | Fisch |
| 2019/0348336 A1 | 11/2019 | Katkar et al. |
| 2019/0385966 A1 | 12/2019 | Gao et al. |
| 2020/0013637 A1 | 1/2020 | Haba |
| 2020/0013765 A1 | 1/2020 | Fountain, Jr. et al. |
| 2020/0075534 A1 | 3/2020 | Gao et al. |
| 2020/0118973 A1 | 4/2020 | Wang et al. |
| 2020/0126906 A1 | 4/2020 | Uzoh et al. |
| 2020/0131028 A1 | 4/2020 | Cheng et al. |
| 2020/0140267 A1 | 5/2020 | Katkar et al. |
| 2020/0140268 A1 | 5/2020 | Katkar et al. |
| 2020/0144217 A1 | 5/2020 | Enquist et al. |
| 2020/0194396 A1 | 6/2020 | Uzoh |
| 2020/0227367 A1 | 7/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0371154 A1 | 11/2020 | DeLaCruz et al. |
| 2020/0395321 A1 | 12/2020 | Katkar et al. |
| 2021/0098412 A1 | 4/2021 | Haba et al. |
| 2021/0134689 A1 | 5/2021 | Huang et al. |
| 2021/0181510 A1 | 6/2021 | Katkar et al. |
| 2021/0193603 A1 | 6/2021 | Katkar et al. |
| 2021/0193625 A1 | 6/2021 | DeLaCruz et al. |

FOREIGN PATENT DOCUMENTS

| | | |
|---|---|---|
| EP | 1688994 B1 | 8/2008 |
| EP | 2546876 A1 | 1/2013 |
| EP | 2555239 A2 | 2/2013 |
| EP | 2813465 A1 | 12/2014 |
| JP | 2000-100679 | 4/2000 |
| JP | 2001-102479 | 4/2001 |
| JP | 2001-148436 | 5/2001 |
| JP | 2002-353416 | 12/2002 |
| JP | 2009-238905 | 10/2009 |
| JP | 2010-199608 | 9/2010 |
| JP | 2013-33786 | 2/2013 |
| JP | 2018-160519 | 10/2018 |
| KR | 10-2005-0101324 | 10/2005 |
| KR | 10-2015-0097798 | 8/2015 |
| KR | 10-2017-0108143 | 9/2017 |
| WO | WO 2004/023111 A1 | 3/2004 |
| WO | WO 2005/022630 A1 | 3/2005 |
| WO | WO 2005/043584 A2 | 5/2005 |
| WO | WO 2006/100444 A1 | 9/2006 |
| WO | WO 2006/124597 A2 | 11/2006 |
| WO | WO 2007/142721 A1 | 12/2007 |
| WO | WO 2009/070348 A1 | 6/2009 |
| WO | WO 2012/169162 A1 | 12/2012 |
| WO | WO 2013/062533 A1 | 5/2013 |
| WO | WO 2014-074403 A1 | 5/2014 |
| WO | WO 2015/138393 A1 | 9/2015 |
| WO | WO 2015/168222 A1 | 11/2015 |
| WO | WO 2015/183884 A2 | 12/2015 |
| WO | WO 2015/187694 A1 | 12/2015 |
| WO | WO 2017/100256 A1 | 6/2017 |
| WO | WO 2017/151442 A1 | 9/2017 |

OTHER PUBLICATIONS

Beer et al., "Coplanar 122GHz Antenna Array With Air Cavity Reflector for Integration in Plastic Packages", IEEE Antennas and Wireless Propagation Letters, 11:160-163, Jan. 2012.

Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.

Chung et al., "Wafer direct bonding of compound semiconductors and silicon at room temperature by the surface activated bonding method," Applied Surface Science, Jun. 2, 1997, vols. 117-118, pp. 808-812.

Farrens et al., "Chemical free room temperature wafer to wafer direct bonding," J. Electrochem. Soc., The Electrochemical Society, Inc., Nov. 1995, vol. 142, No. 11. pp. 3949-3955.

Farrens et al., "Chemical free wafer bonding of silicon to glass and sapphire," Electrochemical Society Proceedings vol. 95-7, 1995, pp. 72-77.

Gösele et al., "Semiconductor Wafer Bonding: A flexible approach to materials combinations in microelectronics; micromechanics and optoelectronics," IEEE, 1997, pp. 23-32.

Gu et al., "A Multilayer Organic Package with 64 Dual-Polarized Antennas for 28GHz 5G Communication", IBM Research, pp. 1-3, 2017.

Hosoda et al., "Effect of the surface treatment on the room-temperature bonding of Al to Si and SiO2," Journal of Materials Science, Jan. 1, 1998, vol. 33, Issue 1, pp. 253-258.

Hosoda et al., "Room temperature GaAs—Si and InP—Si wafer direct bonding by the surface activated bonding method," Nuclear Inst. And Methods in Physics Research B, 1997, vol. 121, Nos. 1-4, pp. 203-206.

Howlader et al., "A novel method for bonding of ionic wafers," Electronics Components and Technology Conference, 2006, IEEE, p. 7—pp.

Howlader et al., "Bonding of p-Si/n-InP wafers through surface activated bonding method at room temperature," Indium Phosphide and Related Materials, 2001, IEEE International Conference On, pp. 272-275.

Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.

Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.

International Search Report and Written Opinion dated Apr. 13, 2018 in International Application No. PCT/US2017/067742, 14 pages.

International Search Report and Written Opinion dated Apr. 16, 2018 in International Application No. PCT/US2017/067741, 17 pages.

International Search Report and Written Opinion dated Mar. 7, 2019, in International Application No. PCT/US2018/060044, 14 pages.

International Search Report and Written Opinion dated Apr. 22, 2019 in International Application No. PCT/US2018/064982, 13 pages.

International Search Report and Written Opinion dated Aug. 26, 2019 in International Application No. PCT/US2019/031113, 14 pages.

Itoh et al., "Characteristics of fritting contacts utilized for micromachined wafer probe cards," 2000 American Institute of Physics, AIP Review of Scientific Instruments, vol. 71, 2000, pp. 2224.

Itoh et al., "Characteristics of low force contact process for MEMS probe cards," Sensors and Actuators A: Physical, Apr. 1, 2002, vols. 97-98, pp. 462-467.

Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.

Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.

Ker, Ming-Dou et al., "Fully process-compatible layout design on bond pad to improve wire bond reliability in CMOS Ics," IEEE

(56) References Cited

OTHER PUBLICATIONS

Transactions on Components and Packaging Technologies, Jun. 2002, vol. 25, No. 2, pp. 309-316.
Kim et al., "Low temperature direct Cu—Cu bonding with low energy ion activation method," Electronic Materials and Packaging, 2001, IEEE, pp. 193-195.
Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—Cu, Cu—Si, and Cu—SiO2 at low temperature," Proceedings—Electrochemical Society, 2003, vol. 19, pp. 239-247.
Matsuzawa et al., "Room-temperature interconnection of electroplated Au microbump by means of surface activated bonding method," Electornic Components and Technology Confererence, 2001, 51st Proceedings, IEEE, pp. 384-387.
Moriceau, H. et al., "Overview of recent direct wafer bonding advances and applications," Advances in Natural Sciences—Nanoscience and Nanotechnology, 2010, 11 pages.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
Norton, Francis, "Permeation of gases through solids," Journal of Applied Physics, Janaury 1957, vol. 28, No. 1.
Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1(l), 6 pages.
Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
Plobi, A. et al., "Wafer direct bonding: tailoring adhesion between brittle materials," Materials Science and Engineering Review Journal, 1999, R25, 88 pages.
Reiche et al., "The effect of a plasma pretreatment on the Si/Si bonding behaviouir," Electrochemical Society Proceedings, 1998, vol. 97-36, pp. 437-444.
Roberds et al., "Low temperature , in situ, plasma activated wafer bonding," Electrochecmical Society Proceedings, 1997, vol. 97-36, pp. 598-606.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP-Cu film for bumpless interconnection," Electronic Components and Technology Confererence, 51st Proceedings, 2001, IEEE, pp. 755-760.
Shingo et al., "Design and fabrication of an electrostatically actuated MEMS probe card," Traducers, Solid-State Sensors, Actuators and Microsystems, 12th International Conference, Jun. 8-12, 2003, vol. 2, pp. 1522-1525.
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Electronic Componentsand Technology Conference, 2002, IEEE, pp. 105-111.
Suga, "UHV room temperature joining by the surface activated bonding method," Advances in science and technology, Techna, Faenza, Italie, 1999, pp. C1079-C1089.
Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.
Takagi et al., "Room-temperature bonding of lithium niobate and silicon wafers by argon-beam surface activation," Appl. Phys. Lett., 1999. vol. 74, pp. 2387.
Takagi et al., "Room temperature silicon wafer direct bonding in vacuum by Ar beam irradiation," Micro Electro Mehcanical Systems, MEMS '97 Proceedings, 1997, IEEE, pp. 191-196.
Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.
Takagi et al., "Room-temperature wafer bonding of silicon and lithium niobate by means of arbon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al., "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.
Tong et al., "Low temperature wafer direct bonding," Journal of Microelectomechanical systems, Mar. 1994, vol. 3, No. 1, pp. 29-35.
Topol et al., "Enabling technologies for wafer-level bonding of 3D MEMS and integrated circuit structures," 2004 Electronics Components and Technology Conference, 2004 IEEE, pp. 931-938.
Wang et al., "Reliability and microstructure of Au—Al and Au—Cu direct bonding fabricated by the Surface Activated Bonding," Electronic Components and Technology Conference, 2002, IEEE, pp. 915-919.
Wang et al., "Reliability of Au bump—Cu direct interconnections fabricated by means of surface activated bonding method," Microelectronics Reliability, May 2003, vol. 43, Issue 5, pp. 751-756.
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.
Xu et al., "New Au—Al interconnect technology and its reliability by surface activated bonding," Electronic Packaging Technology Proceedings, Oct. 28-30, 2003, Shanghai, China, pp. 479-483.
Zhang et al., "Antenna-on-Chip and Antenna-in-Package Solutions to Highly Integrated Millimeter-Wave Devices for Wireless Communications", IEEE Transactions on Antennas and Propagation, 57(10):2830-2841, Oct. 2009.
Zhou et al., "A Wideband Circularly Polarized Patch Antenna for 60 GHz Wireless Communications", Wireless Engineering and Technology, 3:97-105, 2012.

(56) References Cited

OTHER PUBLICATIONS

Ceramic Microstructures: Control at the Atomic Level, Recent Progress in Surface Activated Bonding, 1998, pp. 385-389.
Boyle et al., "Epoxy Resins," 2001, pp. 78-89, vol. 21, ASM Handbook, Composites (ASM International).
Chipscale Review, "The Impact of CSPs on Encapsulation Materials," ChipScale Review publication issue Mar. 1998, retrieved Feb. 21, 2014, 6 pages.
Chiueh, Herming et al., "A Dynamic Thermal Management Circuit for System-On-Chip Designs," Analog Integrated Circuits and Signal Processing, Jan. 25, 2003, 36, pp. 175-181.
Das, Rabindra N. et al., "Package-Interpose-Package (PIP) Technology for High End Electronics," Endicott Interconnect Technologies, Inc., retrieved Jul. 31, 2014, 4 pages.
Dreiza, Moody et al., "Joint Project for Mechanical Qualification of Next Generation High Density Package-on-Package (PoP) with Through Mold Via Technology," Amkor Technology, EMPC2009—17th European Microelectronics & Packaging Conference, June 16th, Remini, Italy, 8 pages.
Final Office Action dated Mar. 2, 2015 of U.S. Appl. No. 14/214,365.
Hybrid Memory Cube Consortium, "Hybrid Memory Cube Specification 1.0," Last Revision Jan. 2013, 122 pages, retrieved from: http:/hybridmemorycube.org/specificationdownload/.
International Preliminary Report on Patentability (IPRP) in PCT Patent Application No. PCT/US2015/019609, dated Sep. 13, 2016, 7 pages.
International Search Report and Written Opinion, dated May 12, 2015, PCT Patent Application No. PCT/US2015/019609, 11 pages.
International Search Report and Written Opinion, dated Aug. 6, 2015, PCT Patent Application No. PCT/US2015/028172, 10 pages.
International Search Report dated Sep. 21, 2015, for International Application No. PCT/US2015/033786, International Filing Date Feb. 6, 2015.
International Search Report and Written Opinion, dated Nov. 23, 2015, PCT Application No. PCT/US2015/032572.
Kim, Jinseong et al., "Application of Through Mold Via (TMV) as PoP base package," Amkor Technology, 2008 IEEE reprinted from ECTC2008 Proceedings, 6 pages.
Lau et al., "Thin-Wafer Handling with a Heat-Spreader Wafer for 2.5D/3D IC Integration," 46th International Symposium on Microelectronics (IMAPS 2013) Sep. 30-Oct. 3, 2013, Orlando, FL USA, pp. 1-8 [389-396].
Lau, John H., "TSV Interposer: The most Cost-Effective Integrator for 30 IC Integration," Electronics Optoelectronics Research Laboratories, Industrial Technology Research Institute (ITRI), retrieved Feb. 24, 2015.
Lee, Sam Hwui et al., "Wafer-to-Wafer Alignment for Three Dimensional Integration: A Review," Journal of Microelectromechanical Systems, vol. 20, Issue 4, Aug. 2011, pp. 885-898.
Magill, Dr. Paul A., "A New Thermal-Management Paradigm for Power Devices," Power Electronics Technology, Nov. 2008, pp. 26-30.
McCormick, Heather et al., "Assembly and Reliatbility Assessment of Fine Pitch TMV Package On Package (PoP) COMPONENTS," Amkor Technology Inc., Originally published in the Proceedings of the SMTA International Conference, San Diego, CA, Oct. 4-8, 2009, 8 pages.
Nakamura et al., "Technology Trends and Future History of Semiconductor Packaging Substrate Material," Hitachi Chemical Review Technical Report No. 55, May 2013, pp. 24-29.
Notice of Allowance dated Apr. 16, 2015 of U.S. Appl. No. 14/268,899.
Office Action dated Jul. 9, 2015 for U.S. Appl. No. 14/558,462, 11 pages.
Pre-Interview First Office Action dated Oct. 22, 2014 of U.S. Appl. No. 14/214,365.
Pulliam, Wayne, "Designing with BGAs," AMO presentation, 2008, 62 pages.
Shang, Li et al., "Thermal Crisis: Challenges and Potential Solutions," Potentials, vol. 25, Issue 5, Sep./Oct. 2006, pp. 31-35.
Strandjord et al., Bumping for WLCSP using Solder Ball Attach on electrolessss NIAu UBM, 2008, 29 pages, Pac Tech USA—Packaging Technologies, Inc., Santa Clara, California.
Turner et al., "Mechanics of direct wafer bonding," 2006, pp. 171-188, vol. 462, doi: 10.1098/rspa.2005.1571, Proceedings of The Royal Society A, London, United Kingdom.
United States Patent and Trademark Office, First Action Interview Pilot Program Pre-Interview Communication, dated Oct. 22, 2014, for U.S. Appl. No. 14/214,365, filed Mar. 14, 2014.
U.S. Appl. No. 14/201,585, filed Mar. 7, 2014.
U.S. Appl. No. 14/214,365 titled, "Integrated Circuits Protected by Substrates with Cavities, and Methods of Manufacture," filed Mar. 14, 2014, 40 pages.
U.S. Appl. No. 14/250,317 titled "Die Stacks With One or More Bond Via Arrays," filed Apr. 10, 2014, 58 pages.
U.S. Appl. No. 14/268,899 titled , "Making Electrical Components in Handle Wafers of Integrated Circuit Packages," filed May 2, 2014.
U.S. Appl. No. 14/288,064 titiled "Integrated Circuit Assemblies With Reinforcement Frames, and Methods of Manufacture," filed May 27, 2014.
U.S. Appl. No. 14/328,380 titled,"Microelectronic Assemblies With Integrated Circuits and Interposers With Cavities, and Methods of Manufacture," filed Jul. 10, 2014.
U.S. Appl. No. 14/558,462, titled "Interposers With Circuit Modules Encapsulated By Moldable Material in a Cavity, and Methods of Fabrication," filed Dec. 2, 2014, 19 pages.
U.S. Appl. No. 14/745,237 titled, "Microelectronic Assemblies With Cavities, and Methods of Fabrication," filed May 19, 2015.
Zoschke, K. et al., "Hermetic wafer level packaging of MEMS components using through silicon via and wafer to wafer bonding technologies," 2013 Electronic Components & Technology Conference, 2013 IEEE, pp. 1500-1507.
Zwenger, Curtis et al., "Next Generation Package-on-Package (PoP) Platform with Through Mold Via (TMV™) Interconnection Technology," Amkor Technology, Originally published in the proceedings of the IMPAS Device Packaging Conference, Scottsdale, AZ, Mar. 10-12, 2009, 8 pages.
Daneman, "Applying the CMOS Test Flow to MEMS Manufacturing", InvenSense, Inc., accessed on Apr. 5, 2020.
Inertial MEMS Manufacturing Trends 2014 Report by Yole Developpement Sample Report, Slide 11, https://www.slideshare.net/Yole_Developpement/yole-inertial-memsmanufacturingtrends2014sample.
"The Advantages of Integrated MEMS to Enable the Internet of Moving Things", mCube, White Paper Jan. 2018.
International Search Report and Written Opinion dated May 31, 2018 in International Application No. PCT/US2018/022688, 2 pages.
Korean Office Action (Notification of Reason for Refusal) (English translation) dated Jan. 5, 2021 for Korean Application No. 10-2016-7028245, 8 pages.

* cited by examiner

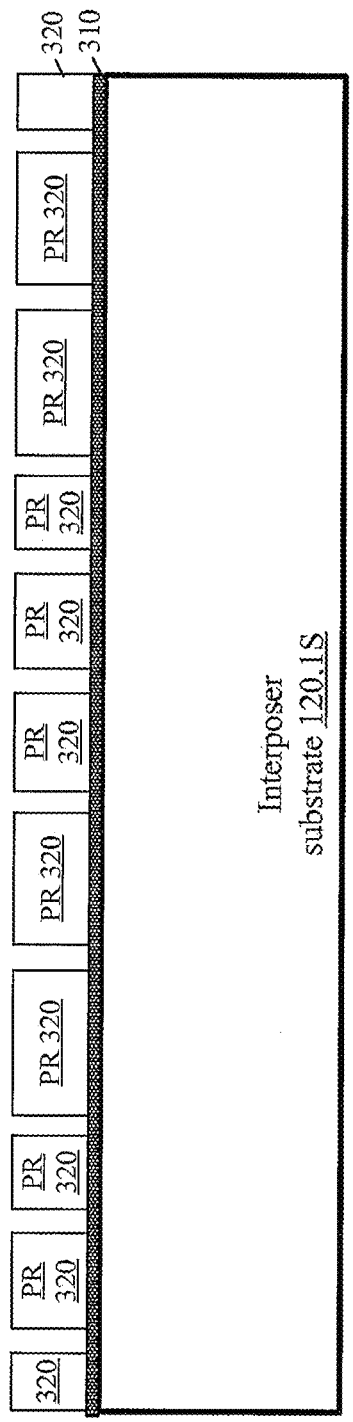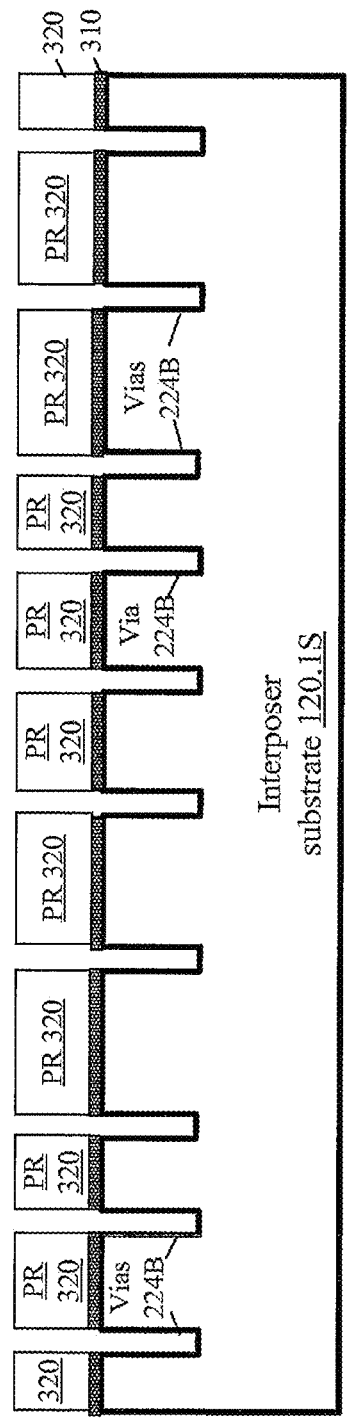

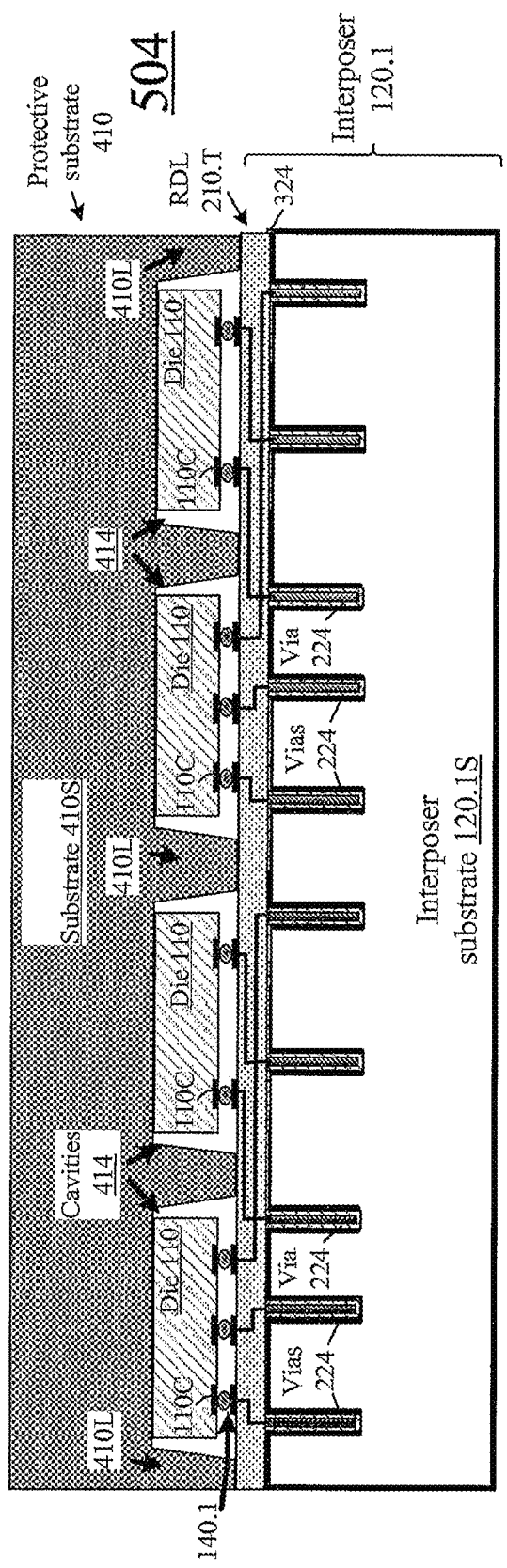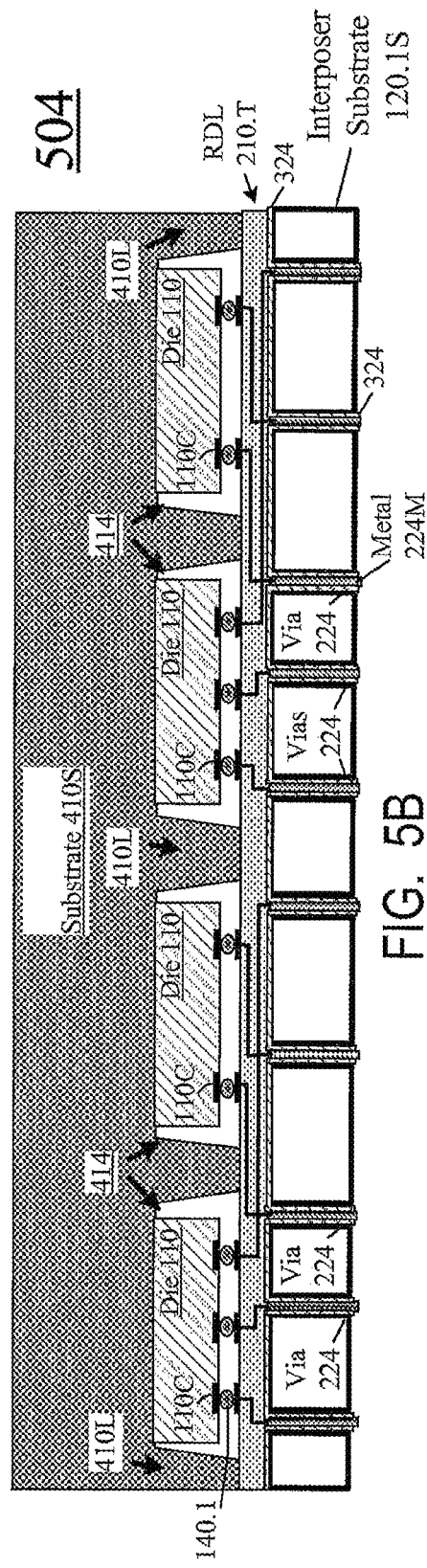
FIG. 5A
FIG. 5B

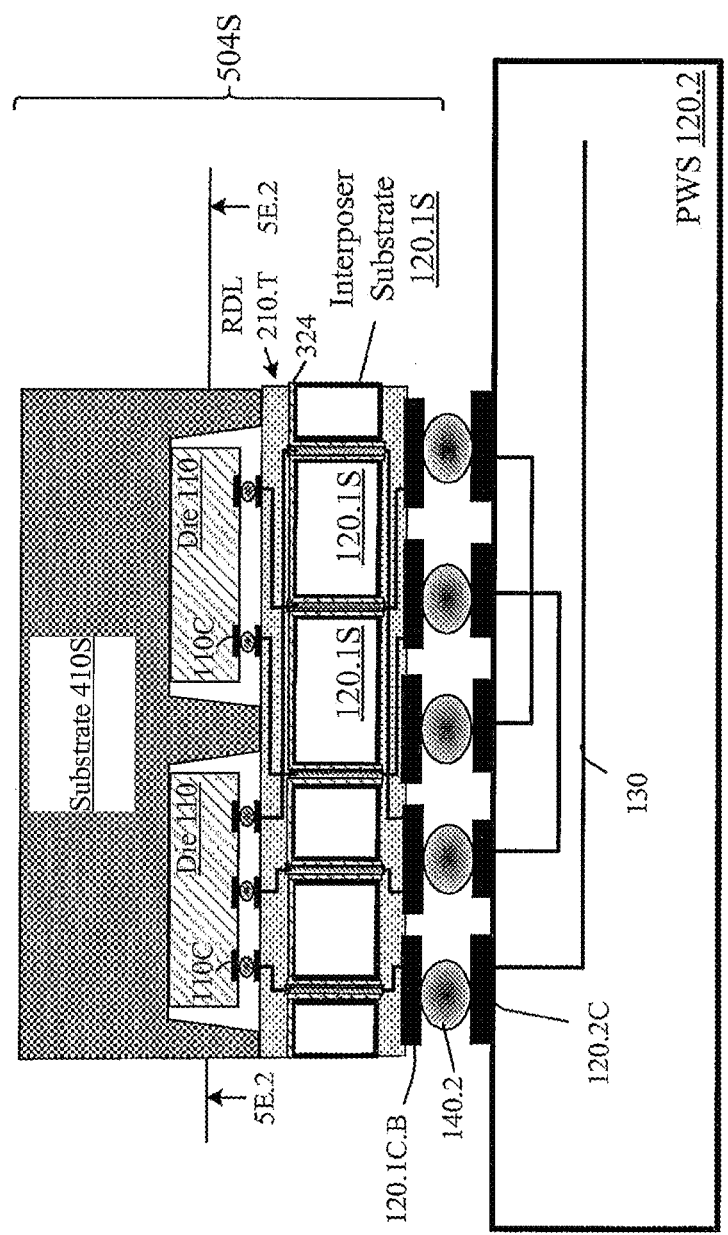
FIG. 5E.1
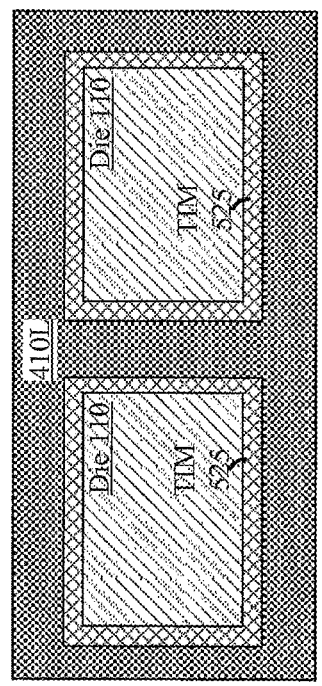
FIG. 5E.2

FIG. 5E.3

INTEGRATED CIRCUITS PROTECTED BY SUBSTRATES WITH CAVITIES, AND METHODS OF MANUFACTURE

CROSS-REFERENCE TO RELATED APPLICATIONS

The present application is a continuation of U.S. patent application Ser. No. 15/865,842, filed Jan. 9, 2018, which is a divisional of U.S. patent application Ser. No. 15/265,148, filed Sep. 14, 2016, now U.S. Pat. No. 9,899,281, which is a continuation of U.S. patent application Ser. No. 14/214,365, filed Mar. 14, 2014, which claims priority of U.S. provisional application No. 61/952,066 filed on Mar. 12, 2014, titled "INTEGRATED CIRCUITS PROTECTED BY SUBSTRATES WITH CAVITIES, AND METHODS OF MANUFACTURE", the disclosures of each of which are incorporated herein by reference in their entirety for all purposes.

BACKGROUND OF THE INVENTION

This document relates to integrated circuits, and more particularly to assemblies having dies that include semiconductor integrated circuits.

In fabrication of integrated circuits, one or more circuits are manufactured in a semiconductor wafer and are then separated into "dies" (also called "chips") in a process called "singulation" or "dicing." The dies, such as shown at 110 in FIG. 1, are attached to a wiring substrate ("WS", e.g. printed wiring board) 120 which has conductive lines 130 connecting the dies to each other and to other elements of the system. More particularly, the dies have contact pads 110C connected to the dies' circuits (not shown), and these contact pads are attached to contact pads 120C of WS 120. Pads 120C are interconnected by conductive lines 130. The attachment of pads 110C to pads 120C is performed by connections 140 which may include solder, conductive epoxy, or other types.

Encapsulant 150 (e.g. epoxy with silica or other particles) protects the dies 110 and the connections 140 from moisture and other contaminants, ultraviolet light, alpha particles, and possibly other harmful elements. The encapsulant also strengthens the die-to-WS attachment against mechanical stresses, and helps conduct heat away from the dies (to an optional heat sink 160 or directly to the ambient (e.g. air)).

It is desirable to provide improved protection of dies from mechanical stresses, heat, and harmful elements.

SUMMARY

This section summarizes some of the exemplary implementations of the invention.

In some embodiments, the dies are protected by an additional, protective substrate attached to a wiring substrate. The dies are located in cavities in the protective substrate (the dies may protrude out of the cavities). The protective substrate may be similar to cap wafers used to protect MEMS components (Micro-Electro-Mechanical Structures); see K. Zoschke et al., "Hermetic Wafer Level Packaging of MEMS Components Using Through Silicon Via and Wafer to Wafer Bonding Technologies" (2013 Electronic Components & Technology Conference, IEEE, pages 1500-1507); see also U.S. Pat. No. 6,958,285 issued Oct. 25, 2005 to Siniaguine. However, in some embodiments, the protective substrate puts pressure on the die (e.g. each die may physically contact the cavity surface) to strengthen the die-to-WS 120 mechanical attachment, to provide good thermal conductivity between the die and the protective substrate, to help flatten the die if it is warped, and to reduce the vertical dimension. The protective substrate may or may not have its own circuitry connected to the dies or to the wiring substrate.

In some embodiments, the die does not contact the cavity surface, but the die is separated from the cavity surface by solid material (e.g. a bonding layer) which physically contacts the die and the cavity surface. In some embodiments, the die or the solid material physically contacts the cavity surface at some but not all operating temperatures (e.g. the physical contact may exist only at higher temperatures at which the die expands). An operating temperature is a temperature at which electrical functionality can be obtained.

In some embodiments, the cavity contains a stack of dies, and the top die in a stack contacts the cavity surface (or a solid material overlying the top die physically contacts the cavity surface). In some embodiments, the entire top surface of each die, or the top die in the stack if there is a stack, physically contacts the cavity surface. In some embodiments, the protective substrate puts downward pressure on the dies in each cavity to strengthen the dies' attachment to the wiring substrate and to counteract the die warpage.

In some embodiments, the wiring substrate is an interposer. Interposers are commonly used as intermediate substrates to accommodate a mismatch between die fabrication technology and printed wiring substrates (PWSs). More particularly, the die's contact pads 110C can be placed much closer to each other (at a smaller pitch) than PWS pads 120C. Therefore (FIG. 2), an intermediate substrate 120.1 can be used between the dies 120 and the PWS (shown at 120.2). Interposer 120.1 includes a substrate 120.1S (e.g. semiconductor or other material), a redistribution layer (RDL) 210.T on top of substrate 120.1S, and another redistribution layer 210.B on the bottom of substrate 120.1S. Each RDL 210.T, 210.B includes interconnect lines 216 insulated from each other and from substrate 120.1S by the RDL's dielectric 220. Lines 216 are connected to contact pads 120.1C.T on top of the interposer and contact pads 120.1C.B on the bottom. Lines 216 of RDL 210.T are connected to lines 216 of RDL 210.B by conductive (e.g. metallized) through-vias 224. Pads 120.1C.T are attached to the dies' pads 110C by connections 140.1 as in FIG. 1. Pads 120.1C.B are attached to pads 120.2C of PWS 120.2 with connections 140.2. Pads 120.1C.B are at a larger pitch than pads 120.1C.T, to accommodate the pitch of the PWS contacts 120.2C.

The interposer substrate 120.1S should be as thin as possible to shorten the signal paths between dies 110 and PWS 120.2 and thus make the system faster and less power hungry. Also, if the interposer is thin, fabrication of metallized vias 224 is facilitated. However, thin interposers are hard to handle: they are brittle, easily warped, and do not absorb or dissipate heat during fabrication. Therefore, a typical fabrication process (such as described in Zoschke et al. cited above) attaches the interposer to a temporary substrate ("support wafer") during fabrication. The support wafer is later removed. Attaching and detaching temporary support wafers is burdensome. The process of the aforementioned U.S. Pat. No. 6,958,285 does not use the support wafer. Neither do some of the novel processes described below.

The invention is not limited to the features and advantages described above, and includes other features described below.

BRIEF DESCRIPTION OF THE DRAWINGS

FIGS. 3A, 3B, 3C, 3D, 3E, 4A, 4B, 4C, 5A, 5B, 5C, 5D, 5E.1, 6, 7, 8A, 8B, 8C, 9A, 9B, 9C, 9D, 10 illustrate vertical cross-sections of structures according to some embodiments as set forth in detail below.

FIGS. 5E.2 and 5E.3 are bottom views of horizontal cross sections according to some embodiments as set forth in detail below.

DESCRIPTION OF SOME EMBODIMENTS

The embodiments described in this section illustrate but do not limit the invention. In particular, the invention is not limited to particular materials, processes, dimensions, or other particulars except as defined by the appended claims.

Figure 3C:
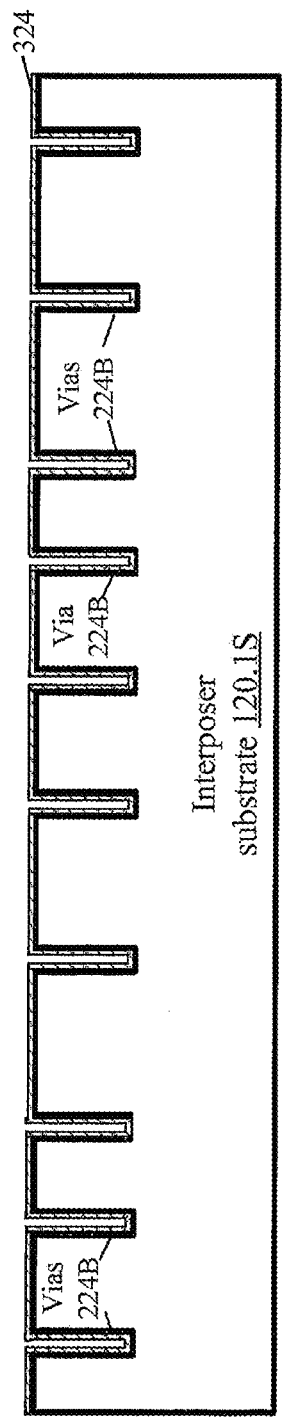

FIG. 3A shows the beginning stages of fabrication of an interposer 120.1 according to some embodiments of the present invention. The interposer substrate 120.1S is initially chosen to be sufficiently thick to provide easy handling and adequate heat dissipation in fabrication. In some embodiments, substrate 120.1S is a monocrystalline silicon wafer of a 200 mm or 300 mm diameter and a thickness of 650 micron or more. These materials and dimensions are exemplary and do not limit the invention. For example, substrate 120.1S can be made of other semiconductor materials (e.g. gallium arsenide), or glass, or sapphire, or metal, or possibly other materials. The substrate will later be thinned; for example, in case of silicon, the final thickness could be 5 to 50 microns. Again, these dimensions are not limiting.

Substrate 120.1S is patterned to form blind vias 224B (FIG. 3B). "Blind" means that the vias do not go through substrate 120.1S. This can be done, for example, as follows for silicon substrates. First, optional layer 310 (FIG. 3A) is formed on substrate 120.1S to protect the substrate and/or improve the adhesion of subsequently formed photoresist 320. For example, layer 310 can be silicon dioxide formed by thermal oxidation, chemical vapor deposition (CVD), or sputtering. Then photoresist 320 is deposited and photolithographically patterned to define the vias. Layer 310 and substrate 120.1S are etched in areas exposed by resist 320 to form the blind vias. The via depth is equal or slightly greater than the final depth of substrate 120.1S, e.g. 5 to 51 microns for some silicon-substrate embodiments. The vias can be formed by a dry etch, e.g. dry reactive ion etching (DRIE). An exemplary diameter of each via can be 60 microns or less, but other dimensions are possible. The vias can be vertical (as shown) or may have sloped sidewalls. As noted above, the particular dimensions, processes and other features are illustrative and not limiting.

The vias are then metallized. If substrate 120.1S is silicon, this can be done as follows. Photoresist 320 and protective layer 310 are removed, and a dielectric layer 324 (FIG. 3C) is formed on the entire top surface of substrate 120.1S. Dielectric 324 lines the via surfaces. In some embodiments, dielectric 324 is formed by thermal oxidation of the silicon substrate or by CVD or physical vapor deposition (PVD). Dielectric 324 will electrically insulate the substrate from subsequently formed metal in vias 224B. The dielectric thickness depends on the desired process parameters, and is 1 micron in an exemplary thermal-oxide embodiment (a thermal oxide is silicon dioxide formed by thermal oxidation). Other dimensions and materials can be used instead. Dielectric 324 can be omitted if substrate 120.1S is itself dielectric.

Figure 3D:
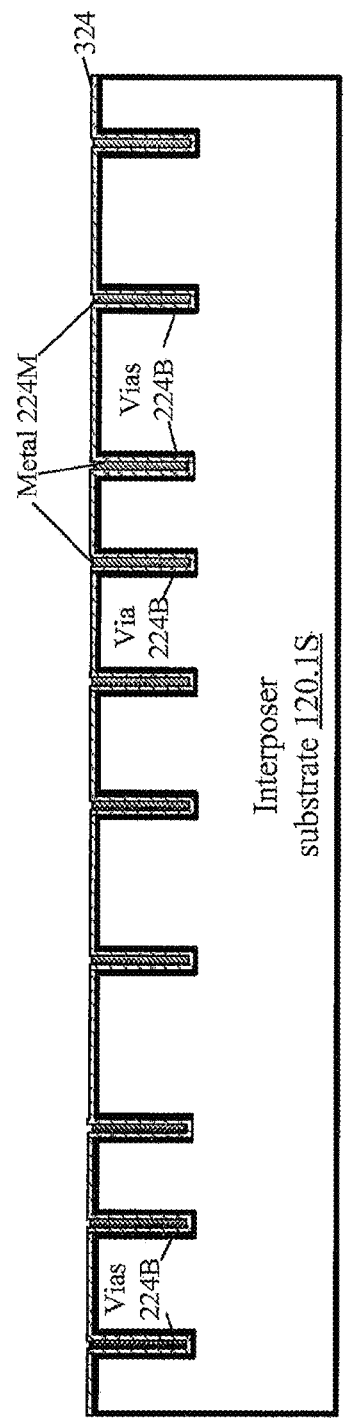

Then metal 224M (FIG. 3D) is formed in vias 224B over the dielectric 324. In the embodiment shown, metal 224M fills up the vias, but in other embodiments the metal is a liner on the via surfaces. In an exemplary embodiment, metal 224M is electroplated copper. For example, a barrier layer (metal or dielectric, not shown separately) is formed first on dielectric 324 to aid in copper adhesion and prevent copper diffusion into the dielectric 324 or substrate 120.1S. Suitable barrier layers may include a layer of titanium-tungsten (see Kosenko et al., US pre-grant patent publication 2012/0228778 published Sep. 13, 2012, incorporated herein by reference), and/or nickel containing layers (Uzoh et al., US 2013/0014978 published Jan. 17, 2013, incorporated herein by reference). Then a seed layer, e.g. copper, is formed on the barrier layer by physical vapor deposition (e.g. PVD, possibly sputtering). Then copper is electroplated on the seed layer to fill the vias 224B and cover the whole substrate 120.1S. The copper is then removed from the areas between the vias by chemical mechanical polishing (CMP). Optionally, the CMP may also remove the barrier layer (if present) from these areas, and may stop on dielectric 324. As a result, the copper and the barrier layer remain only in and over the vias 224B.

For ease of description, we will refer to vias 224 as "metallized", but non-metal conductive materials can also be used (e.g. doped polysilicon).

If layer 224M does not fill the vias but only lines the via surfaces, some other material (not shown) can be formed on layer 224M as a filler to fill the vias and provide a planar top surface for the wafer. This filler material can be polyimide deposited by spin coating for example.

Figure 1:
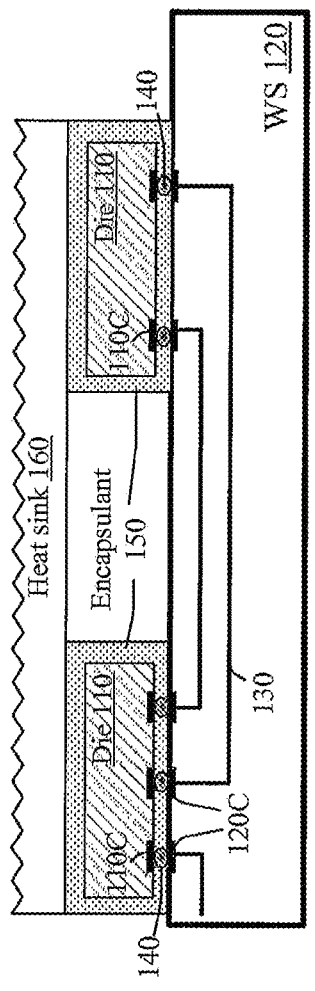
FIGS. 1 and 2 illustrate vertical cross-sections of assemblies including integrated circuits and constructed according to prior art.
Figure 2:
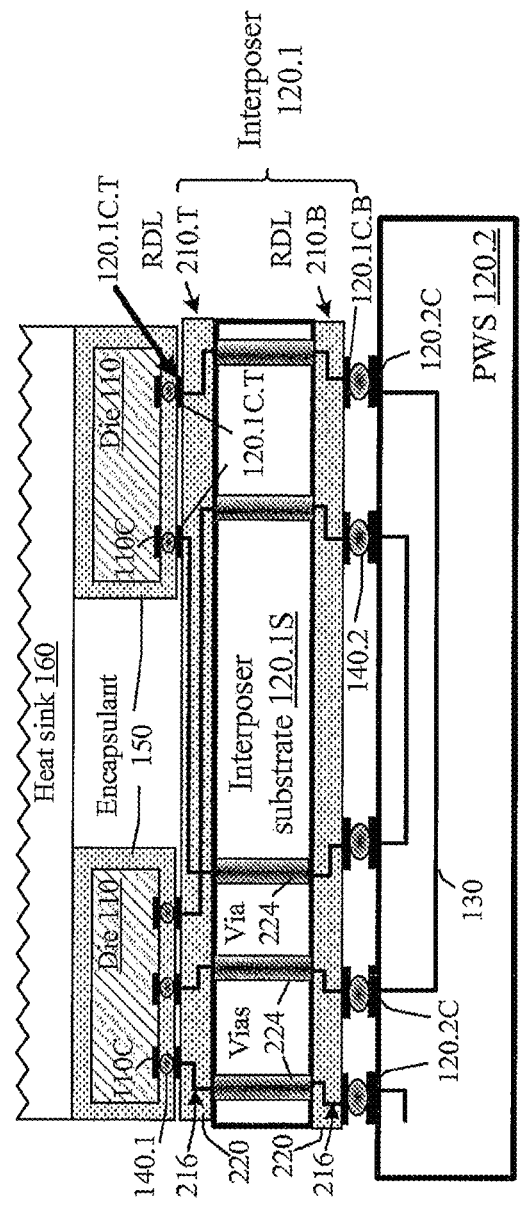
Figure 3E:
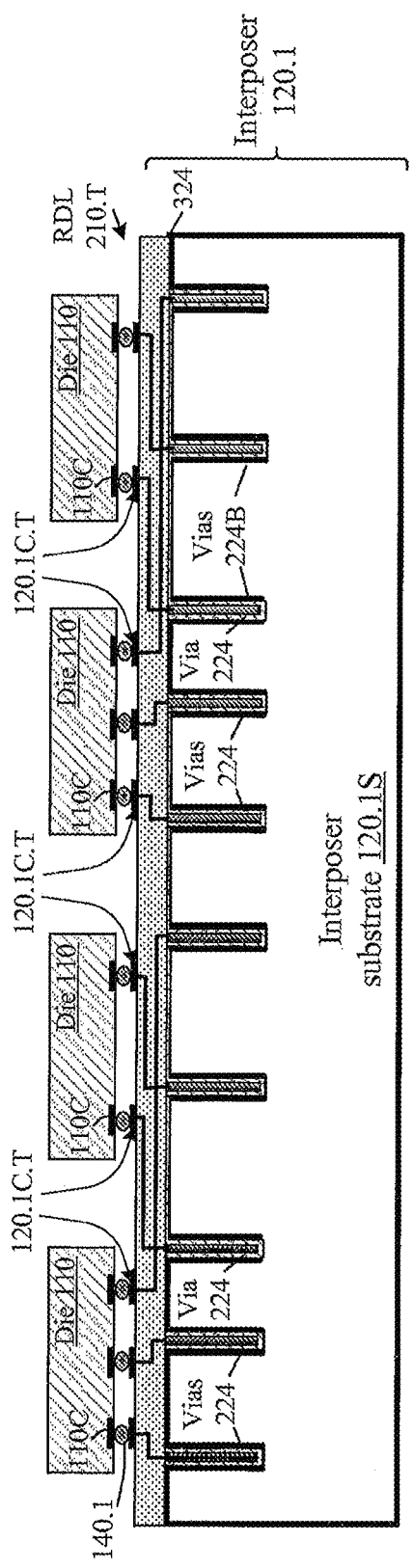

Optionally, RDL 210.T (FIG. 3E) is formed on top of substrate 120.1S to provide contact pads 120.1C.T at desired locations. RDL 210.T can be formed by prior art techniques described above in connection with FIGS. 1 and 2 for example. RDL 210.T is omitted if the contact pads 120.1C.T are provided by the top areas of metal 224M. In such a case, if substrate 120.1S is not dielectric, then a dielectric layer can be formed on the substrate and photolithographically patterned to expose the contact pads 120.1C.T.

Interposer 120.1 may include transistors, resistors, capacitors, and other devices (not shown) in substrate 120.1S and redistribution layer 210.T. These devices can be formed before, during and/or after the fabrication of vias 224 and RDL 210.T using the process steps described above and/or additional process steps. Such fabrication techniques are well known. See e.g. the aforementioned U.S. Pat. No. 6,958,285 and pre-grant patent publication 2012/0228778.

Dies 110 are attached to contact pads 120.1C.T with connections 140.1, using possibly prior art methods described above in connection with FIGS. 1 and 2 or other methods (e.g. diffusion bonding; in this case the connections 140.1 are not additional elements but are part of contact pads 110C and/or 120.1C.T).

Optionally, an encapsulant (not shown) can be formed around the dies and/or under the dies using the same techniques as described above in connection with FIG. 1 (e.g. by molding and/or underfilling). The encapsulant can be any suitable material (e.g. epoxy with silica or other particles). No encapsulant is used in some embodiments. Other embodiments use an encapsulant, but the requirements for the encapsulant are relaxed because the dies will be protected by an additional, protective substrate 410 (FIG.

5A) as described below. In some embodiments, the encapsulant is provided only underneath the dies (as underfill), i.e. only between the dies and substrate 120.1S (around the connections 140.1).

Figure 4A:
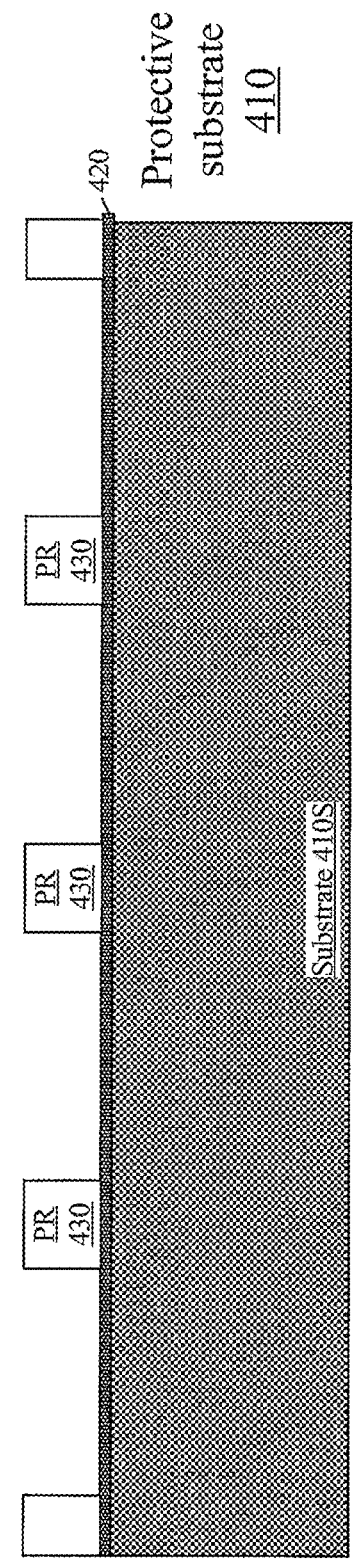
Figure 4B:
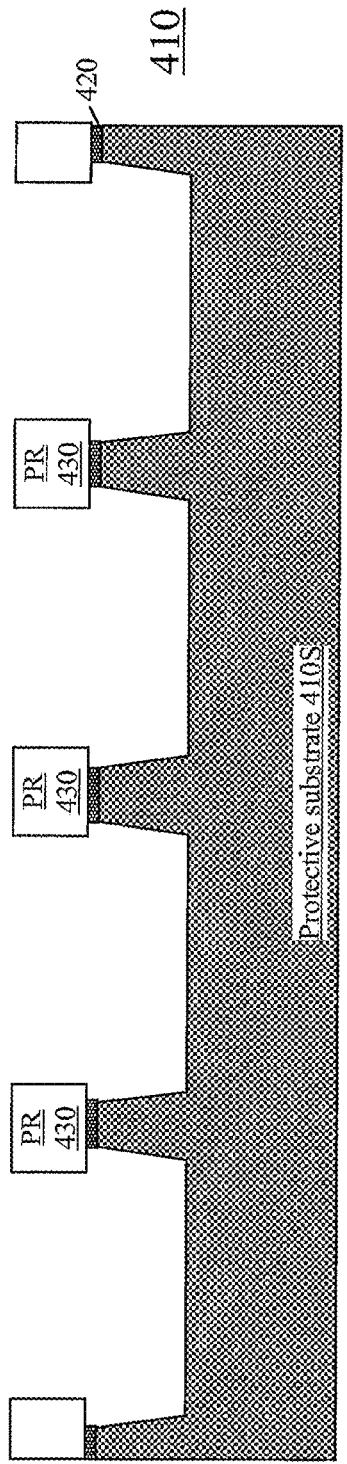
Figure 4C:
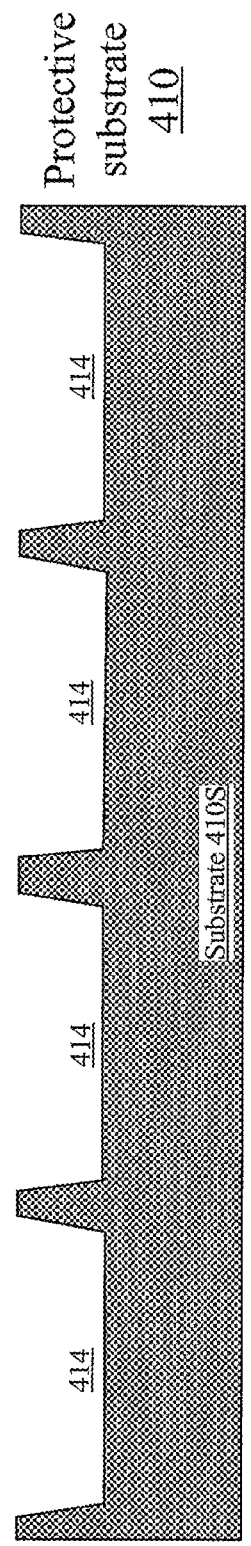

FIGS. 4A-4C illustrate fabrication of protective substrate 410. Many variations are possible. Substrate 410 should be sufficiently rigid to facilitate subsequent handling of the assembly as explained below. In the embodiment shown, substrate 410 includes monocrystalline silicon substrate 410S of a thickness 650 microns or higher. Other materials and thicknesses are possible, based on any factors that may be important (including the availability of materials and processes). One possible factor is reducing the mismatch of the coefficients of thermal expansion (CTE) between substrates 410 and 120.1S: if substrate 120.1S is silicon, then substrate 410S could be silicon or another material with a similar CTE. Another factor is reducing the CTE mismatch between substrate 410 and dies 110. In some embodiments, substrate 410S will not have any circuitry, but if circuitry is desired in or on substrate 410S then this may affect the choice of material. The circuitry can be fabricated before, and/or during, and/or after the steps described below.

Another possible factor is high thermal conductivity to enable the substrate 410 to act as a heat sink. For example, metal may be appropriate.

Cavities 414 (FIG. 4C) are formed in substrate 410 to match the size and position of dies 110. An exemplary process is as follows (this process is appropriate for a silicon substrate 410S, and may be inappropriate for other materials; known processes can be used for silicon or other materials). First, an auxiliary layer 420 (FIG. 4A) is formed to cover the substrate 410S for protection or for improved adhesion of subsequently formed photoresist 430. Resist 430 is deposited and patterned photolithographically to define the cavities. Auxiliary layer 420 exposed by the resist openings is etched away. Then substrate 410S is etched in these openings to form cavities 414 with sloped, upward-expanding sidewalls. The cavity depth depends on the thickness of dies 410 and connections 140.1 as explained below. Non-sloped (vertical) or retrograde sidewalls, or other sidewall profiles are also possible.

Then photoresist 430 is removed. In the example shown, auxiliary layer 420 is also removed, but in other embodiments layer 420 remains in the final structure.

As shown in FIG. 5A, substrate 410 is attached to interposer 120.1 so that each die 110 fits into a corresponding cavity 414. More particularly, legs 410L of protective substrate 410 are attached to the top surface of interposer 120.1 (e.g. to RDL 210.T if the RDL is present; legs 410L are those portion(s) of protective substrate 410 that surround the cavities). The substrate-to-interposer attachment is shown as direct bonding, but other types of attachments (e.g. by adhesive) can also be used as described further below. The entire assembly is marked with numeral 504.

In FIG. 5A, the dies' top surfaces physically contact the top surfaces of cavities 414. In some embodiments, each die's top surface is bonded to the cavity top surface (directly or in some other way, e.g. by adhesive). This bonding increases the bonding strength between the two substrates and improves the thermal conductivity of the thermal path from the dies to the protective substrate.

In other embodiments, the dies are not bonded to the cavities' top surfaces, and thus the dies' top surfaces can slide laterally along the cavities' top surfaces in thermal movement. This may reduce the thermal stresses, e.g. if the die-interposer CTE matching is better than the matching between the interposer and protective substrate 410.

As noted above, in some embodiments the dies are underfilled and/or encapsulated from above by a suitable stress-relieving material, e.g. epoxy. In case of encapsulation from above, the encapsulant may be a solid material (possibly thermosetting) physically contacting the top surfaces of cavities 414. The encapsulant may or may not be bonded to the cavity surfaces as described above, with benefits similar to those described above for the no-encapsulant embodiments.

To ensure physical contact between the dies (or the encapsulant) and the cavities, the top surfaces of the dies (or encapsulant) should have uniform height. To improve the height uniformity, the dies (or encapsulant) can be polished before joining of substrate 410 to interposer 120.1. Suitable polishing processes include lapping, grinding, and chemical mechanical polishing (CMP). Also, before inserting the dies into cavities, the cavity surfaces and/or the dies can be provided with a suitable temperature interface material (TIM, not shown here but shown at 525 in FIGS. 5E.2 and 5E.3 discussed below) to improve the thermal transfer between the dies and substrate 410. TIM's thermal conductivity can usually be higher than that of air. Exemplary TIMs are those that exist in semisolid, gel-like (grease-like) state throughout the range of expected operating temperatures (e.g. 0° C. to 200° C. for some assemblies) or at least when the temperatures are high to make die cooling particularly desirable (20° C. to 200° C. for some assemblies). The gel-like materials fill free spaces between the dies and substrate 410 to provide a thermally conductive path away from the dies. An exemplary TIM material is a thermal grease available from Arctic Silver, Inc. (having an office in California, USA); the grease's thermal conductivity is 1 W/mK.

After the bonding of substrate 410 to interposer 120.1, the interposer is thinned from the bottom to expose the metal 224M (FIG. 5B). The thinning involves partial removal of substrate 120.1S and dielectric 324 (if the dielectric is present). The thinning may be performed by known techniques (e.g. mechanical grinding or lapping of substrate 120.1S followed by dry or wet, masked or unmasked etch of substrate 120.1S and dielectric 324; the substrate and the dielectric are etched simultaneously in some embodiments.) In some embodiments, dielectric 324 protrudes out of substrate 120.1S around metal 224M at the end of the thinning operation, and metal 224M protrudes out of the dielectric. See for example the aforementioned U.S. Pat. No. 6,958,285. As noted above, the invention is not limited to particular processes.

Advantageously, interposer 120.1 is kept flat by substrate 410, so the handling of the assembly 504 is facilitated. Substrate 410 also helps absorb and dissipate the heat generated during this and subsequent fabrication stages and in subsequent operation of assembly 504. The final thickness of substrate 120.1S can therefore be very low, e.g. 50 microns or even 5 microns or less. Hence, blind vias 224B (FIG. 3B) can be shallow. The shallow depth facilitates fabrication of the metallized vias (i.e. facilitates the via etch and subsequent deposition of dielectric and metal into the vias). The shallow depth also shortens the signal paths through the vias. Moreover, if the vias are shallow, each via can be narrower while still allowing reliable dielectric and metal deposition. The via pitch can therefore be reduced.

If desired, protective substrate 410 can be thinned from the top; this is not shown. The combined thickness of substrates 120.1S and 410 is defined by desired properties, such as rigidity, resistance to warpage, heat dissipation, and assembly size.

Figure 5C:
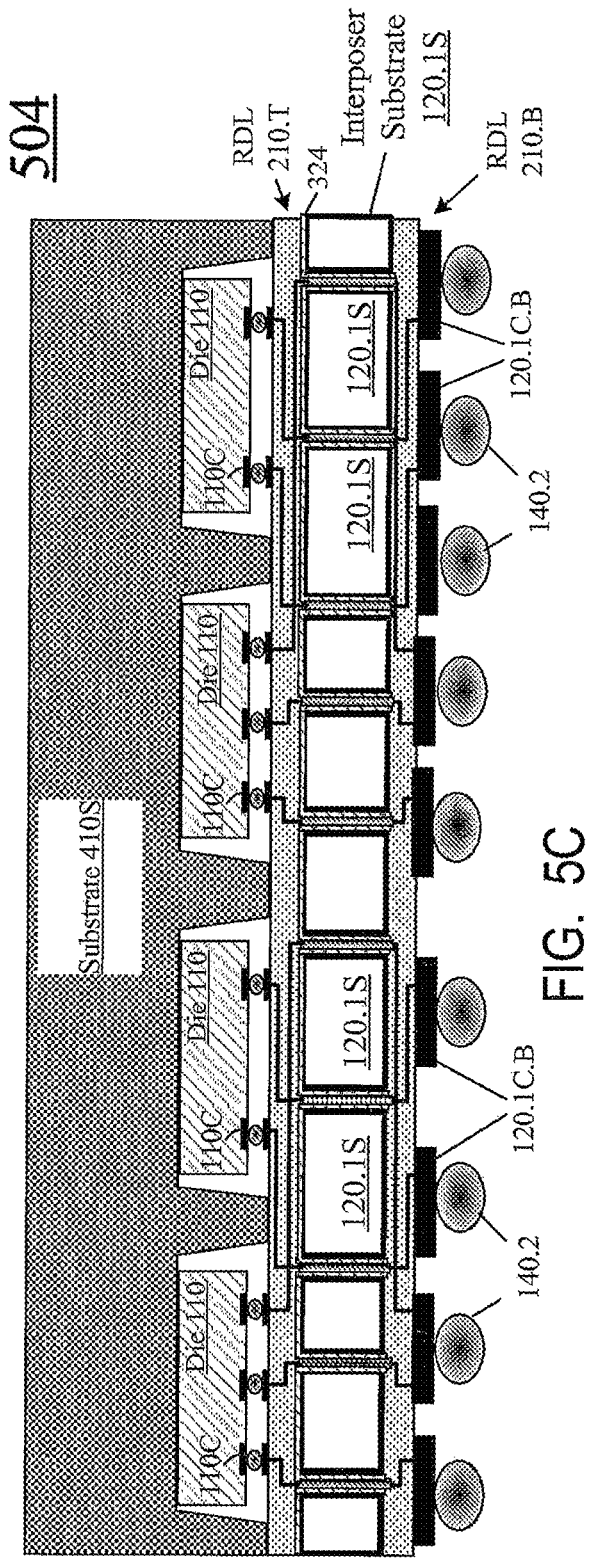
Figure 5D:
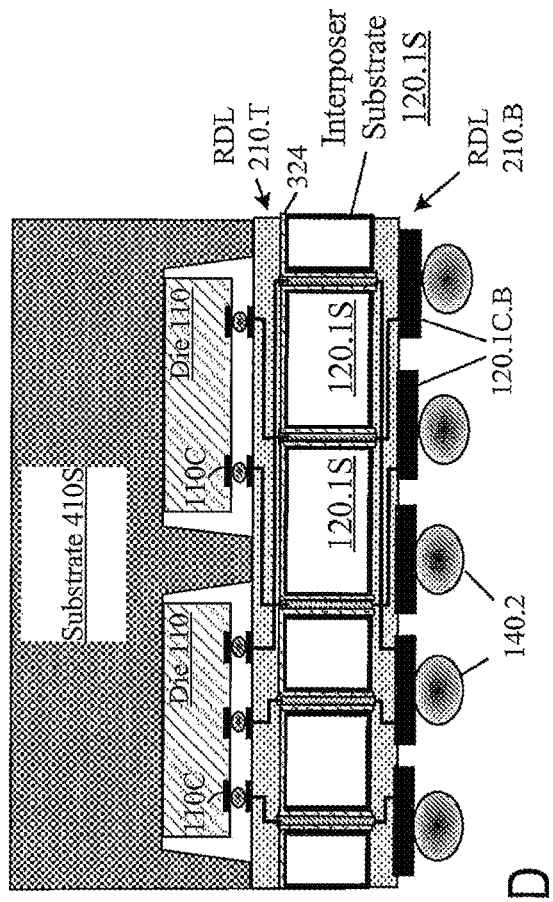
Figure 5D:
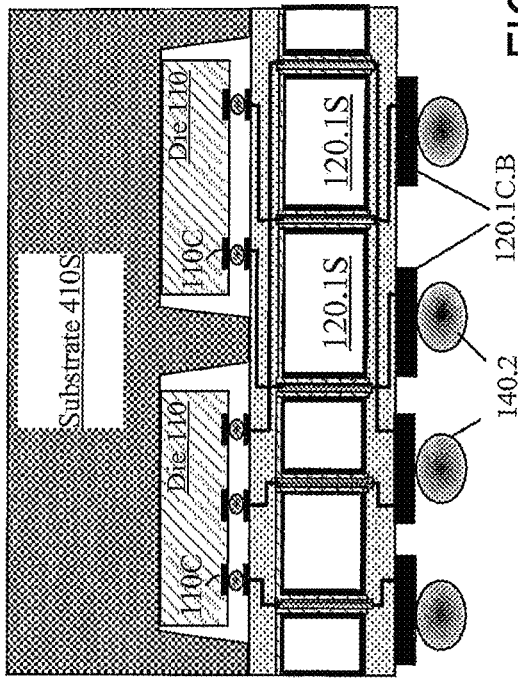

Subsequent process steps depend on the particular application. In some embodiments (FIG. 5C), RDL 210.B is formed on the bottom of substrate 120.1S, possibly using prior art techniques (as in FIG. 2 for example). The RDL provides contact pads 120.1C.B and connects them to metal 224M. (If the RDL is omitted, the contact pads are provided by metal 224M). If desired, the assembly 504 can be diced into stacks 504S (FIG. 5D). Then the stacks (or the entire assembly 504 if dicing is omitted) are attached to other structures, such as wiring substrate 120.2 (e.g. a printed wiring substrate) in FIG. 5E.1. In the example of FIG. 5E.1, a stack 504S is attached to PWS 120.2, and more particularly the stack's contacts 120.1C.B are attached to PWS contacts 120.2C, possibly by the same techniques as in FIG. 1 or 2. Conductive lines 130 of PWS 120.2 connect the contact pads 120.2C to each other or other elements. These details are not limiting.

FIG. 5E.2 shows a possible bottom view of the horizontal cross section along the line 5E.2-5E.2 in FIG. 5E.1. In the example of FIG. 5E.2, the dies are surrounded by temperature interface material (TIM) 525. The legs 410L form a region completely surrounding each die, and the interposer area bonded to the legs also completely surrounds each die.

FIG. 5E.3 shows another possible bottom view of the same horizontal cross section, also with TIM 525. In this example, the legs 410L are provided only on two opposite sides of each die (left and right sides) but are not provided above and below the dies. Each cavity 414 is a horizontal groove in substrate 410S, possibly containing multiple dies spread laterally along the groove. The groove may run through the entire substrate. Other cavity shapes are also possible.

Figure 6:
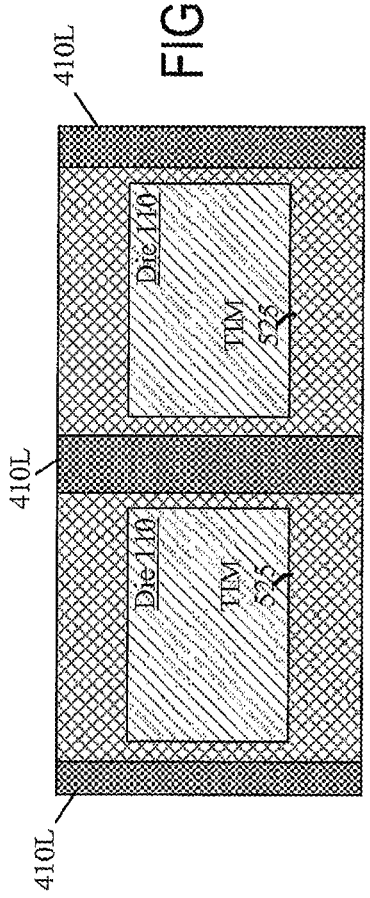
FIGS. 6, 7, 8A, 8B, 8C, 9A, 9B, 9C, 9D, 10, 11, 12 illustrate vertical cross-sections of structures according to some embodiments as set forth in detail below.
Figure 6:
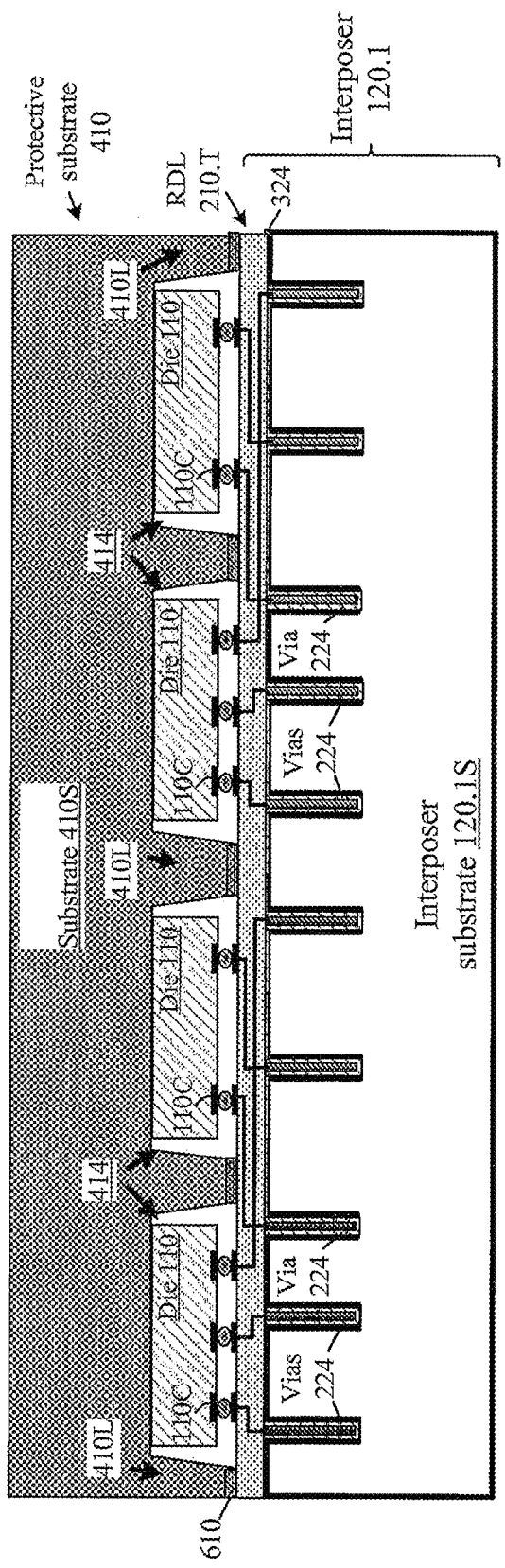

As noted above, protective substrate 410 and interposer 120.1 can be bonded by adhesive, and FIG. 6 illustrates such bonding by adhesive 610. Adhesive 610 is provided on legs 410L or the corresponding areas of interposer 120.1 or both. The structure is shown at the stage of FIG. 5A (before interposer thinning). In some embodiments, the adhesive is elastic, with a low elasticity modulus (e.g. silicone rubber with elasticity modulus of 50 MPa), to help absorb the thermal expansion of dies 110 (so that the pressure from the expanding dies 110 would not damage the protective substrate 410 or the dies). In some embodiments, this is beneficial if the dies' CTE is equal to or greater than the CTE of protective substrate 410 or substrate 410S. The adhesive's elasticity also absorbs the height non-uniformity of the top surfaces of dies 110 or the top surfaces of cavities 414. Also, to absorb the dies expansion, the adhesive may have a CTE equal to or greater than the dies' CTE. Exemplary adhesives are epoxy-based underfills.

Figure 7:
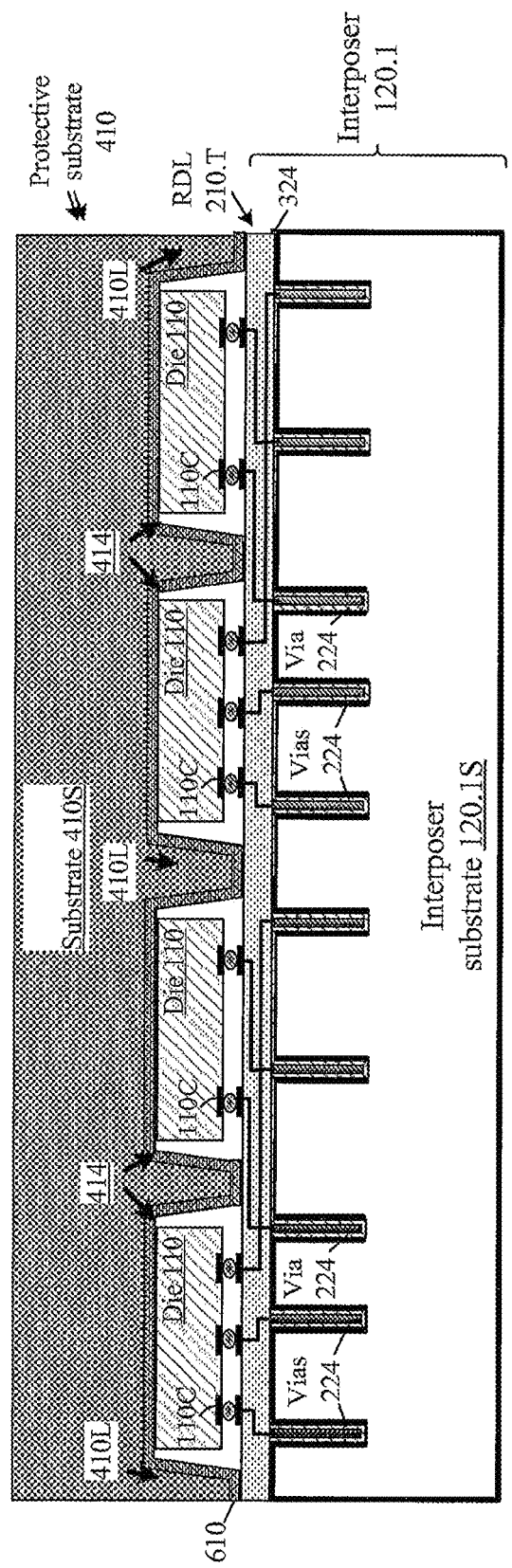

FIG. 7 shows a similar embodiment, but the adhesive 610 covers the whole bottom surface of protective substrate 410S. The adhesive bonds the dies' (or encapsulant's) top surfaces to the top surfaces of the cavities. The adhesive's CTE can be equal to, or greater than, or less than, the dies' CTE.

Figure 8A:
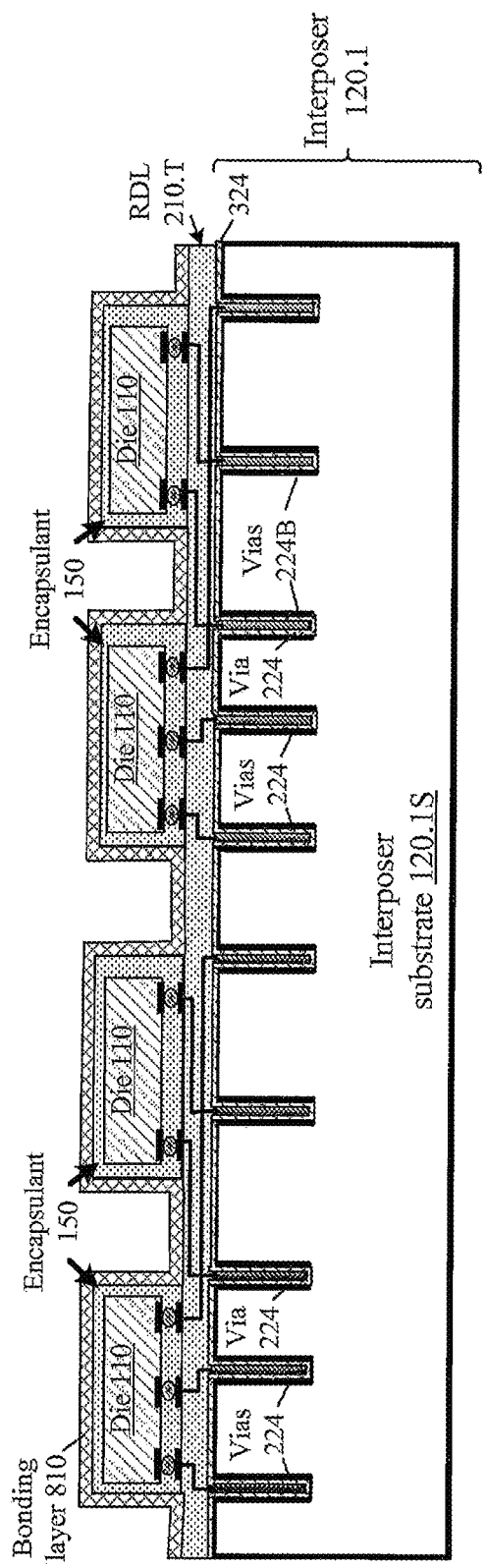
Figure 8B:
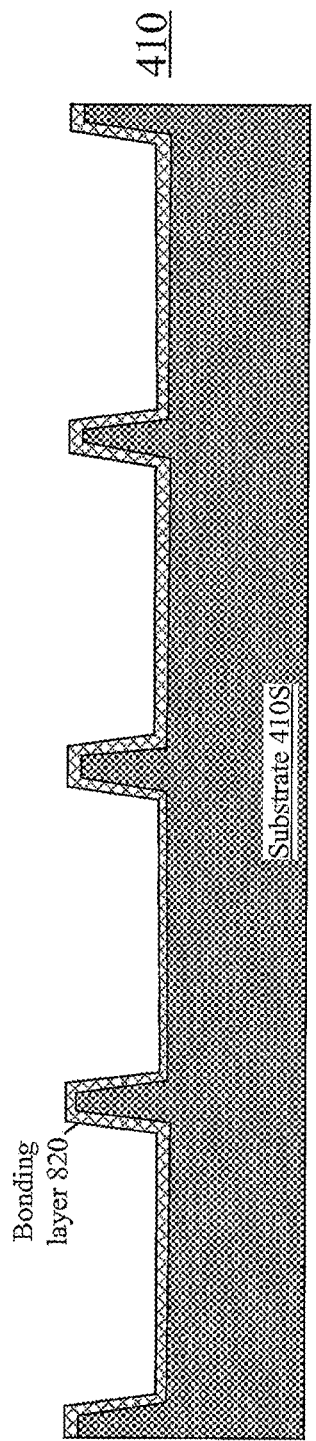
Figure 8C:
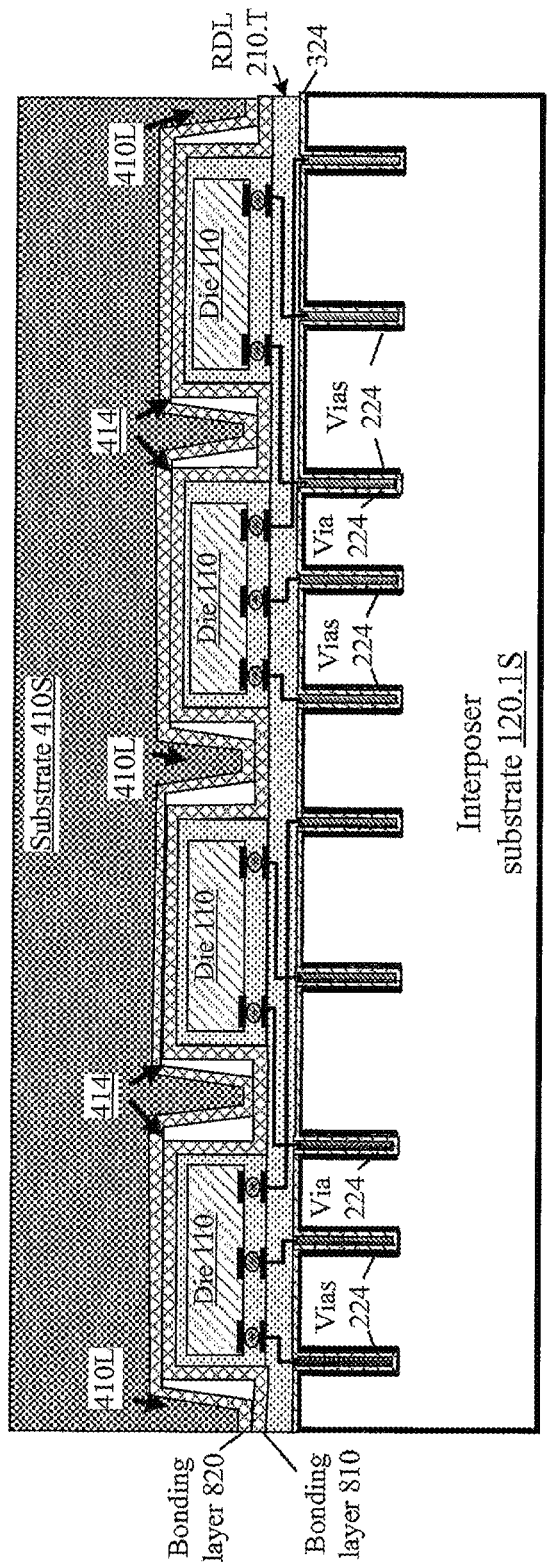

FIGS. 8A-8C illustrate the use of separate bonding layers 810, 820 to directly bond the protective substrate 410 to interposer 120.1. In some embodiments, the bonding layers are silicon dioxide, but other materials can also be used (e.g. metals for eutectic bonding). Referring to FIG. 8A, the dies are attached to interposer 120.1 as in FIG. 3E; the dies are then optionally underfilled and/or encapsulated from above (in FIG. 8A, encapsulant 150 encapsulates and underfills the dies). Bonding layer 810, e.g. silicon dioxide or metal, is formed to cover the interposer and the dies (and the encapsulant if present), by any suitable techniques (e.g. sputtering).

Referring to FIG. 8B, the protective substrate 410 is provided with cavities as in FIG. 4C. Then a bonding layer 820, e.g. silicon dioxide or metal, is formed to cover the substrate surface by any suitable techniques (e.g. sputtering, or thermal oxidation if substrate 410S is silicon).

Referring to FIG. 8C, the interposer is joined to substrate 410 so that the layers 810, 820 physically contact each other. The structure is then heated to bond the layer 820 to layer 810 where the two layers meet, i.e. at legs 410L and at the cavities' top surfaces. In some embodiments however, before the bonding, the layer 820 is removed at the cavities' top surfaces not to bond the dies to the cavities' top surfaces.

Subsequent processing of the structures of FIGS. 6-8A (interposer thinning, possible dicing, etc.) can be as described above for other embodiments.

The process step sequences described above are not limiting; for example, the vias 224 can be formed after the interposer thinning. FIGS. 9A-9D illustrate an exemplary process. Interposer 120.1 is fabricated essentially as in FIG. 3E or 6 or 8A, but without vias 224 (the vias will be formed later). In particular, dielectric 324 is a flat layer on interposer substrate 120.1S. Then contact pads 910 are formed on substrate 120.1S at the locations of future vias 224. RDL 210.T is optionally fabricated on top of the interposer to connect the contact pads 910 to pads 120.1C.T on top of the interposer. (Alternatively, the pads 120.1C.T can be provided by pads 910.) Dies 110 are attached to pads 120.1C.T, and optionally underfilled and encapsulated. Bonding layer 810 (as shown) is optionally deposited as in FIG. 8A for bonding to the protective substrate (alternatively, the bonding can be by an adhesive as in FIG. 6 or 7, or by a direct bonding process as described above in relation to FIG. 5A).

Figure 9A:
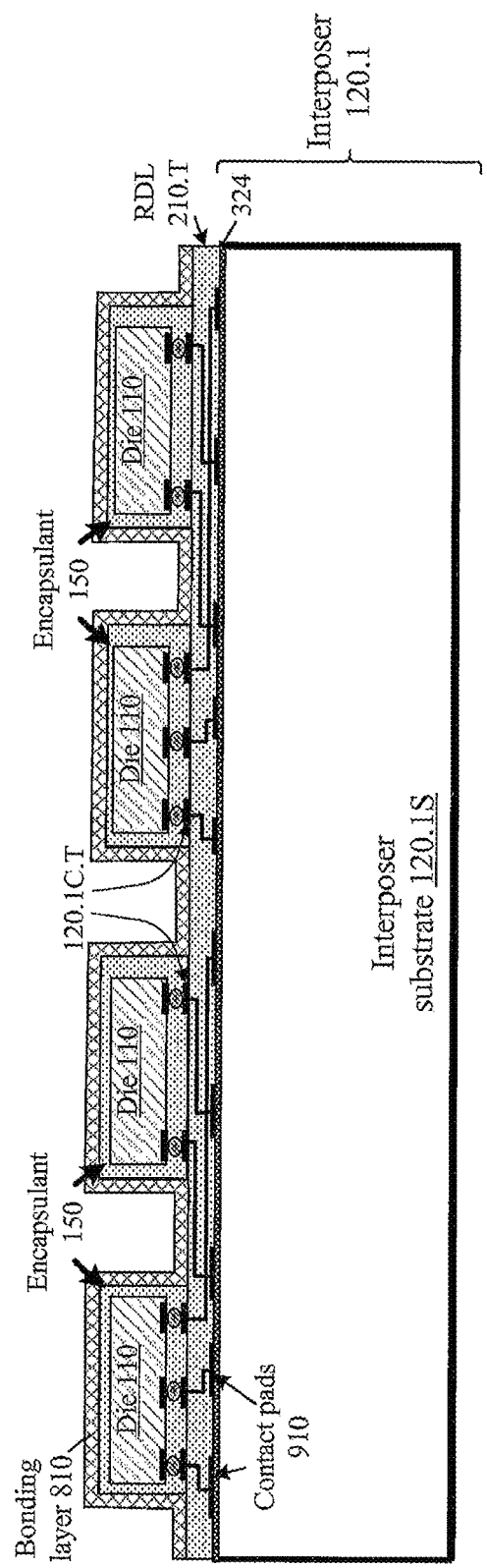
Figure 9B:
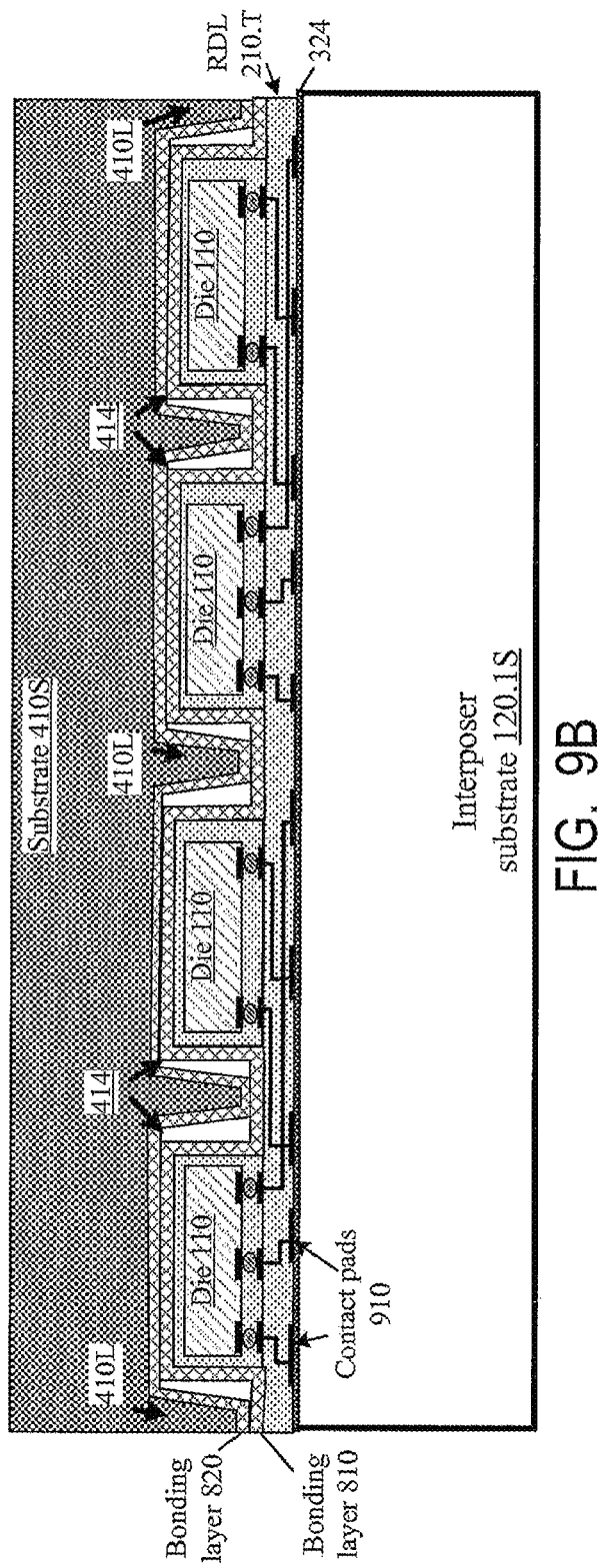
Figure 9C:
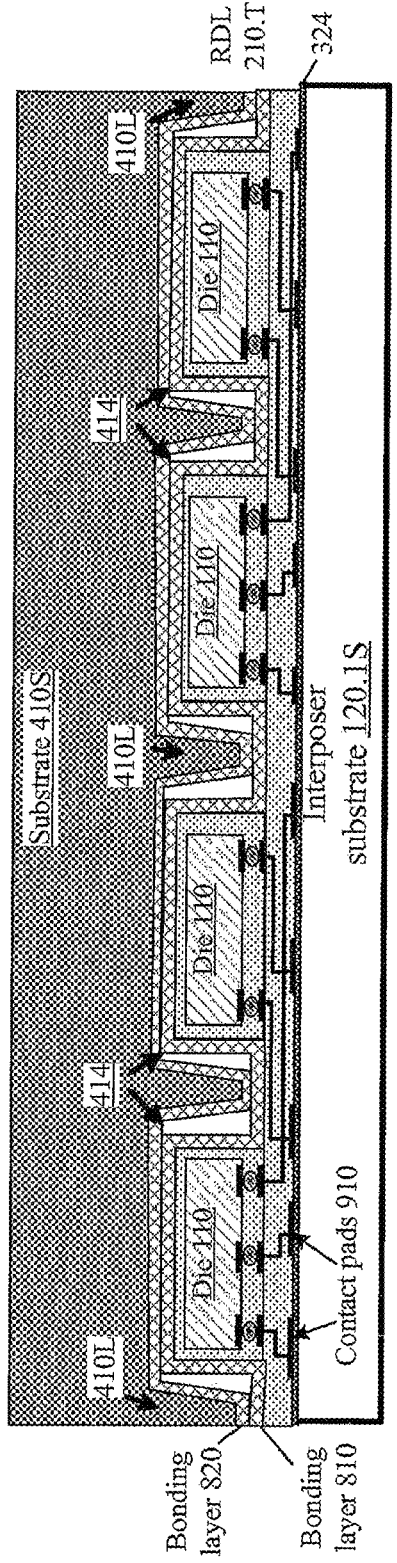
Figure 9D:
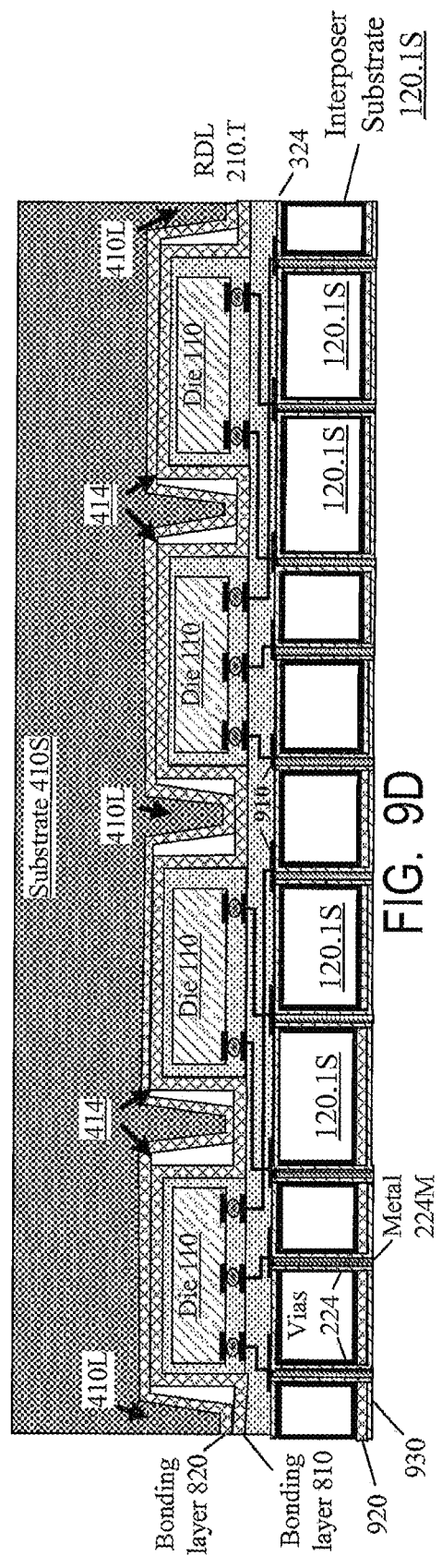

Interposer 120.1 with the dies attached is then bonded to protective substrate 410 (FIG. 9B) as in any embodiment described above. Then the interposer is thinned (FIG. 9C). The dies will be protected by substrate 410 during subsequent steps. Substrate 410 can be thinned at any desired stage.

Then metallized vias 224 are formed from the interposer bottom. An exemplary process is as follows:

1. Dielectric 920 (e.g. silicon dioxide or silicon nitride) is deposited (e.g. by sputtering or CVD) to cover the bottom surface of interposer substrate 120.1S.

2. Vias (through-holes) are etched from the bottom through dielectric 920 and substrate 120.1S. This is a masked etch which stops on contact pads 910.

3. Dielectric 930 (e.g. silicon dioxide or silicon nitride) is deposited (e.g. by sputtering or CVD) to cover the bottom surface of interposer substrate 120.1S and to line the vias. Dielectric 930 covers the contact pads 910 from the bottom.

4. Dielectric 930 is etched to expose the contact pads 910. This can be a masked etch. Alternatively, a blanket anisotropic (vertical) etch can be used to remove the dielectric 930 from over at least a portion of each contact pad 910 while leaving the dielectric on the via sidewalls. The vertical etch may or may not remove dielectric 930 outside the vias.

5. A conductive material 224M (e.g. metal) is formed in the vias, possibly by the same techniques as described above (e.g. copper electroplating). The conductive material is not present outside the vias (e.g. it can be polished away by CMP). The conductive material may fill the vias or just line the via surfaces. The conductive material in each via physically contacts the corresponding pad 910.

Subsequent processing steps can be as described above in connection with FIGS. 5C-5E.3. In particular, the bottom RDL 210.B (FIG. 5C) and connections 140.2 can be formed as described above. The structure can be diced if desired (FIG. 5D), and attached to another structure (e.g. PWS 120.2 in FIG. 5E.1).

Figure 10:
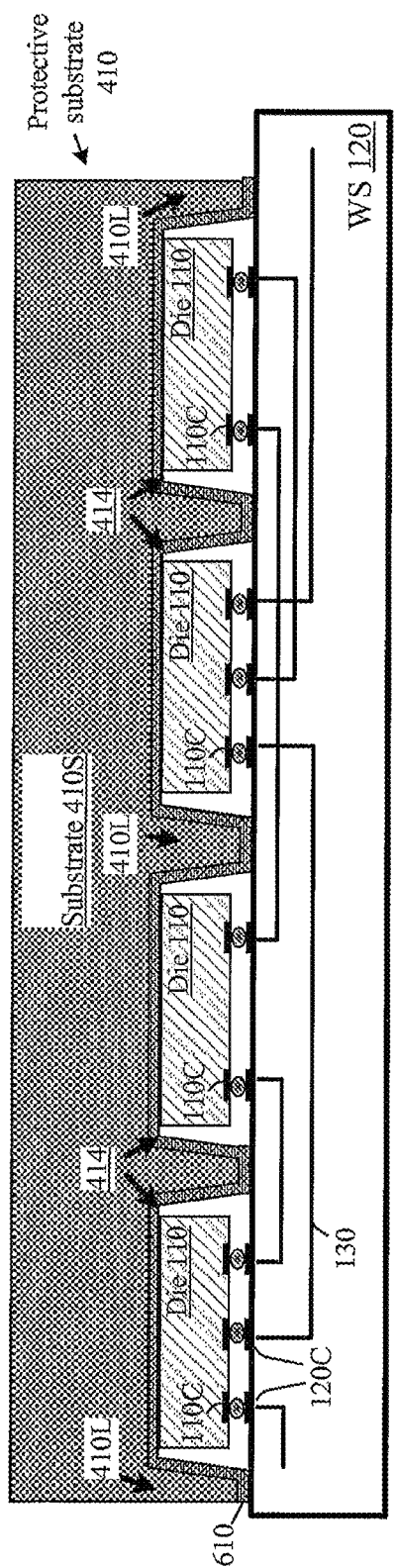

Vias 224 are optional, and further the substrate 120.1 can be any wiring substrate, such as shown at 120 in FIG. 10. This figure illustrates an embodiment using an adhesive 610 to bond the protective substrate 410 to WS 120 at legs 410L and at the cavity top surfaces, but any other bonding method described above can be used. No underfill or other encapsulant is shown, but underfill with or without encapsulation of the entire die can be present.

The techniques described above in connection with FIGS. 5A-10 can be used to attach any number of separate protective substrates 410 to the same interposer 120.1 or WS 120; different protective substrates 410 can be attached to the same side of a substrate 120.1 or 120, with different dies in different cavities of the same or different protective substrates 410. Other protective substrates 410 can be attached to the opposite side of substrate 120.1 or 120. Some of the dies may have no protective substrate 410 to protect them. Each substrate 120.1S or 410S can be a wafer, and the two substrates can be of the same size in a given assembly 504; but different sizes are also possible in the same assembly.

Figure 11:
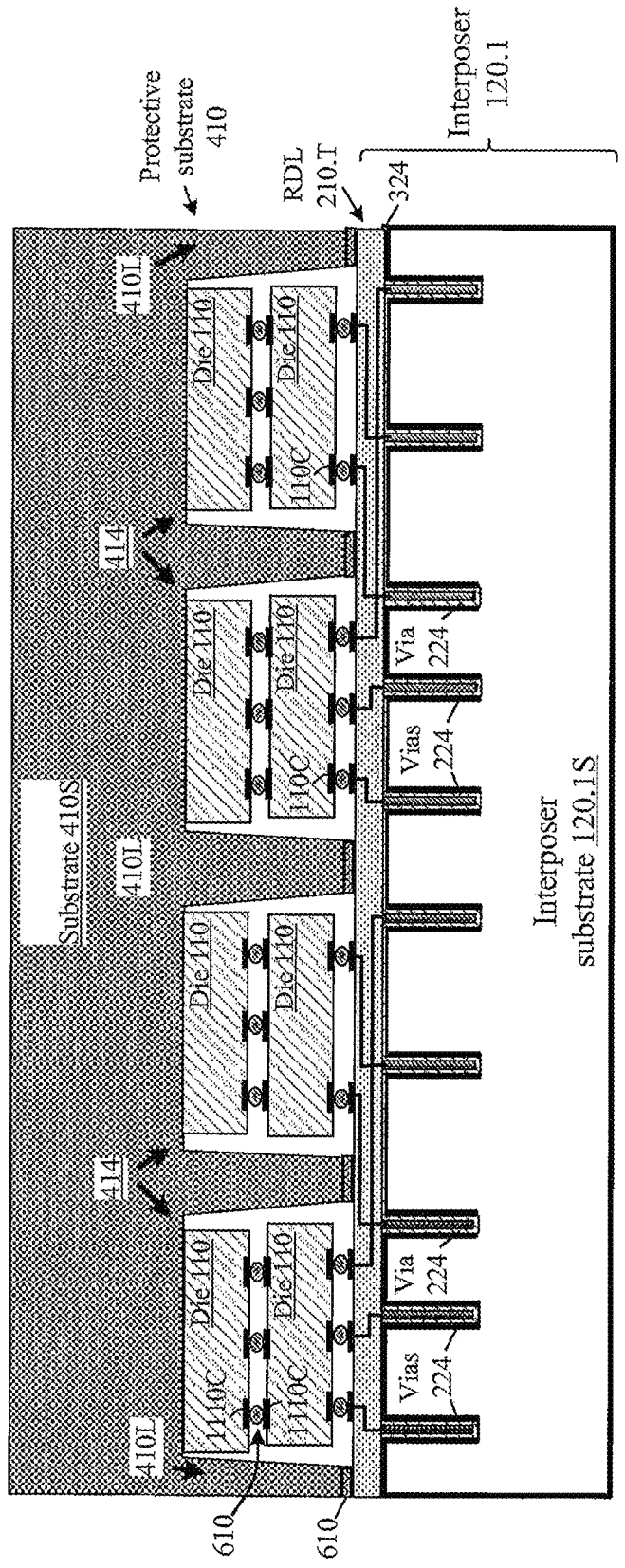

The dies can also be stacked one above another in the same cavity (see FIG. 11 showing the structure at the same fabrication stage as FIG. 6), with only the top die of each stack physically contacting the corresponding cavity's top surface. The dies in each stack may have their respective circuits interconnected through their contact pads 1110C and respective connections 140 (which can be of any type described above). In FIG. 11, substrates 120.1S, 410S are bonded together by adhesive 610 on legs 410L as in FIG. 6, but the other bonding methods described above can also be used. Stacked dies can also be used with other variations described above, e.g. when the protective substrate is bonded directly to the PWS.

Figure 12:
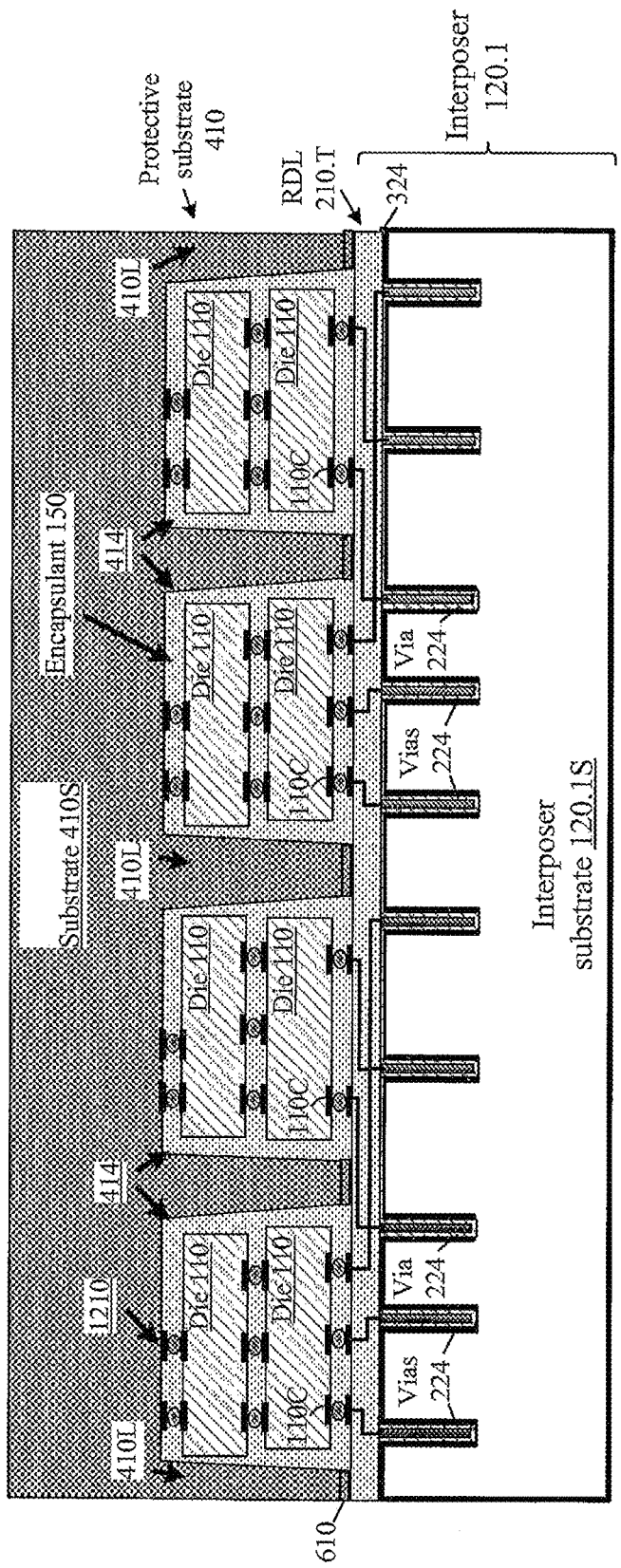

In some embodiments, substrate 410S has circuitry, possibly connected to the circuitry in the dies and/or the interposer 120.1S or the PWS. See FIG. 12, showing the top dies connected to substrate 410S by structures 1210; each structure 1210 includes a contact pad in substrate 410S, a corresponding contact pad on a top die 110, and a connection (e.g. solder or any other type described above) bonding the two contact pads to each other. In the example of FIG. 12, encapsulant 150 underfills and completely surrounds each die, contacting the cavities' top surfaces. As noted above, encapsulation and/or underfilling are optional.

The invention is not limited to the embodiments described above. For example, the vias 224 can be formed after the RDLs, and can be etched through one or both of the RDLs.

Some embodiments provide a manufacture comprising:

a first substrate (e.g. 120.1 or 120) comprising one or more first contact pads (e.g. the top pads 120.1C.T);

one or more dies attached to the first substrate, each die comprising a semiconductor integrated circuit which comprises one or more contact pads each of which is attached to a respective first contact pad;

a second substrate (e.g. 410 or 410S) comprising one or more cavities, the second substrate being attached to the first substrate, wherein at least part of each die is located in a corresponding cavity in the second substrate, the second substrate comprising a surface area (e.g. a surface of legs 410L) which lies outside of the cavities and is attached to the first substrate;

wherein at least at some temperature at which the structure is electrically operable, at least one die satisfies one or both of conditions (A) and (B):

(A) the die physically contacts a surface of the corresponding cavity;

(B) the die is separated from the surface of the corresponding cavity by solid material (e.g. an encapsulant or a bonding layer) which physically contacts the die and the surface of the corresponding cavity.

In some embodiments, in a side view in which each cavity is in a bottom surface of the second substrate (e.g. as in FIG. 5C or 5E.1), said surface area of the second substrate laterally surrounds each cavity (e.g. as in FIG. 5E.2).

In some embodiments, the at least one die is attached to the surface of the corresponding cavity.

In some embodiments, the at least one die is not attached to the surface of the corresponding cavity.

In some embodiments, the one or more first contact pads are located at a first side of the first substrate;

the first substrate comprises one or more second contact pads at a second side opposite to the first side (e.g. contact pads 120.1C.B at the interposer bottom); and the first substrate comprises one or more electrically conductive paths passing through the first substrate (e.g. metallized vias 224) and electrically connecting at least one first contact pad to at least one second contact pad.

In some embodiments, at least one of the conditions (A) and (B) is satisfied at room temperature.

In some embodiments, the at least one die is under pressure from the second substrate.

In some embodiments, the pressure does not exceed 200 MPa at room temperature. In some embodiments, the pressure is greater than the atmospheric pressure (1 bar, i.e. $10^5$ Pa), and can be in the range from 1 bar to 200 MPa or any sub-range of this range. The pressure can also be above or below this range.

Some embodiments provide a method for fabricating an electrically functioning manufacture, the method comprising:

obtaining a first substrate (e.g. 120.1) comprising a first side and one or more first contact pads at the first side;

attaching one or more dies to the first substrate, each die comprising a semiconductor integrated circuit which comprises one or more contact pads each of which is attached to a respective first contact pad;

obtaining a second substrate (e.g. 410) comprising one or more cavities;

attaching the second substrate to the first substrate, with at least part of each die being located in a corresponding cavity in the second substrate, the second substrate comprising a surface area (e.g. bottom areal of legs 410L) which lies outside of the cavities and is attached to the first substrate;

wherein at least at some temperature at which the structure is electrically operable, at least one die satisfies one or both of conditions (A) and (B):

(A) the die physically contacts a surface of the corresponding cavity;

(B) the die is separated from the surface of the corresponding cavity by solid material which physically contacts the die and the surface of the corresponding cavity.

In some embodiments, in a side view in which each cavity is in a bottom surface of the second substrate, said surface area of the second substrate laterally surrounds each cavity.

In some embodiments, the at least one die is attached to the surface of the corresponding cavity.

In some embodiments, the at least one die is not attached to the surface of the corresponding cavity.

In some embodiments, the one or more first contact pads are located at a first side of the first substrate;

the first substrate comprises one or more second contact pads at a second side opposite to the first side; and the first substrate comprises one or more electrically conductive paths passing through the first substrate and electrically connecting at least one first contact pad to at least one second contact pad.

In some embodiments, at least one of the conditions (A) and (B) is satisfied at room temperature.

In some embodiments, the at least one die is under pressure from the second substrate when the first substrate is attached to the second substrate.

In some embodiments, the pressure does not exceed 200 MPa at room temperature.

In some embodiments, the one or more dies are a plurality of dies, and the method further comprises polishing a solid surface at a first side of the dies before attaching the first substrate to the second substrate, the first side of the dies being a side opposite to each die's one or more contact pads, the solid surface being a surface of the dies or of an encapsulant formed on the dies.

In some embodiments, the solid surface is a surface of the encapsulant which comprises an epoxy.

Some embodiments provide a manufacture comprising:

a first substrate comprising one or more first contact pads;

one or more dies attached to the first substrate, each die comprising a semiconductor integrated circuit which comprises one or more contact pads each of which is attached to a respective first contact pad;

a second substrate comprising one or more cavities, the second substrate being attached to the first substrate, wherein at least part of each die is located in a corresponding cavity in the second substrate, the second substrate comprising a surface area which lies outside of the cavities and is attached to the first substrate;

wherein at least at some temperature at which the structure is electrically operable, at least one die is under pressure from the second substrate.

In some embodiments, the pressure does not exceed 200 MPa at room temperature.

In some embodiments, in a side view in which each cavity is in a bottom surface of the second substrate, said surface area of the second substrate laterally surrounds each cavity.

In some embodiments, the at least one die is attached to the surface of the corresponding cavity.

In some embodiments, wherein the at least one die is not attached to the surface of the corresponding cavity.

In some embodiments, wherein the one or more first contact pads are located at a first side of the first substrate;

the first substrate comprises one or more second contact pads at a second side opposite to the first side; and the first substrate comprises one or more electrically conductive paths passing through the first substrate and electrically connecting at least one first contact pad to at least one second contact pad.

Other embodiments and variations are within the scope of the invention, as defined by the appended claims.

What is claimed is:

1. A structure comprising:
   a first semiconductor element including a cavity extending into the first semiconductor element from a first side, the first semiconductor element having a leg defining a sidewall of the cavity, a lower surface of the leg further defining the first side of the first semiconductor element;
   a second semiconductor element directly bonded to the first side of the first semiconductor element without an intervening adhesive along a bond interface, the bond interface comprising a direct metallic bond extending along the lower surface of the leg to the sidewall of the cavity, the second semiconductor element enclosing the cavity of the first semiconductor element; and
   a conductive via extending through the second semiconductor element, the conductive via disposed laterally offset from the bond interface and within a lateral footprint of the cavity.

2. The structure of claim 1, further comprising a first bonding layer at a first surface of the first semiconductor element and a second bonding layer at a second surface of the second semiconductor element, the first and second bonding layers directly bonded to one another without an intervening adhesive.

3. The structure of claim 2, wherein the first and second bonding layers comprise respective metallic bonding layers.

4. The structure of claim 2, wherein the first bonding layer is at least partially disposed on the sidewall of the cavity.

5. A structure comprising:
   a first semiconductor element including a cavity extending into the first semiconductor element from a first side, the first semiconductor element having a leg defining a sidewall of the cavity, a lower surface of the leg further defining the first side of the first semiconductor element;
   a second semiconductor element directly bonded to the first side of the first semiconductor element without an intervening adhesive along a bond interface extending along the lower surface of the leg to the sidewall of the cavity, a portion of the bond interface disposed in the cavity, the second semiconductor element enclosing the cavity of the first semiconductor element;
   a conductive via extending through the second semiconductor element, the conductive via disposed laterally offset from the bond interface;
   a first bonding layer at a first surface of the first semiconductor element; and
   a second bonding layer at a second surface of the second semiconductor element, the first and second bonding layers directly bonded to one another without an intervening adhesive,
   wherein the first and second bonding layers comprise silicon oxide.

6. The structure of claim 1, wherein the second semiconductor element comprises an interposer substrate, the conductive via extending through the interposer substrate.

7. The structure of claim 6, wherein the second semiconductor element further comprises a redistribution layer, the redistribution layer directly bonded to the first semiconductor element.

8. The structure of claim 1, further comprising a die mounted to the second semiconductor element within the cavity.

9. The structure of claim 1, wherein the first semiconductor element includes circuitry.

10. The structure of claim 1, further comprising a lower substrate, the second semiconductor element bonded to the lower substrate by way of an electrical connection.

11. The structure of claim 5, further comprising a die mounted to the second semiconductor element within the cavity.

12. A structure comprising:
a semiconductor cap including a cavity, the semiconductor cap having a first silicon dioxide bonding layer on a bonding surface of the semiconductor cap, the first silicon dioxide bonding layer at least partially disposed in the cavity;
a semiconductor substrate having a second silicon dioxide bonding layer, the first and second silicon dioxide bonding layers directly bonded to one another without an intervening adhesive along a bond interface, a portion of the bond interface disposed in the cavity; and
a conductive via disposed through the semiconductor substrate, the conductive via disposed laterally offset from the bond interface and within a lateral footprint of the cavity.

13. The structure of claim 12, wherein the semiconductor cap structure includes circuitry.

14. The structure of claim 12, further comprising a die disposed in the cavity.

15. The structure of claim 12, wherein the semiconductor substrate further comprises a redistribution layer, the redistribution layer directly bonded to the semiconductor cap.

16. A structure comprising:
a semiconductor cap including a cavity, the semiconductor cap having a leg defining a sidewall of the cavity, a lower surface of the leg further defining a lower surface of the semiconductor cap;
a substrate having a redistribution layer, the leg of the semiconductor cap directly bonded to the redistribution layer of the substrate without an intervening adhesive along a bond interface, the bond interface comprising a direct metallic bond extending along the lower surface of the leg to the sidewall of the cavity; and
a conductive via through the substrate, the conductive via disposed within a lateral footprint of the cavity.

17. The structure of claim 16, further comprising a die disposed in the cavity.

18. A structure comprising:
a first semiconductor element including a cavity extending into the first semiconductor element from a first side, the first semiconductor element having a leg defining a sidewall of the cavity, a lower surface of the leg further defining the first side of the first semiconductor element;
a second semiconductor element eutectically bonded to the first side of the first semiconductor element along a bond interface, the bond interface comprising a direct eutectic bond between metallic layers extending along the lower surface of the leg to the sidewall of the cavity, the second semiconductor element enclosing the cavity of the first semiconductor element; and
a conductive via extending through the second semiconductor element, the via disposed laterally offset from the bond interface and within a lateral footprint of the cavity.

19. The structure of claim 18, further comprising a first metallic bonding layer on the first semiconductor element and a second metallic bonding layer on the second semiconductor element, the first and second bonding layers eutectically bonded to one another.

20. The structure of claim 18, further comprising a die disposed in the cavity.

21. The structure of claim 18, further comprising a lower substrate, the second semiconductor element bonded to the lower substrate by way of an electrical connection.

22. The structure of claim 18, wherein the first semiconductor element includes circuitry.

* * * * *